(12) United States Patent
Sung et al.

(10) Patent No.: US 11,785,861 B2
(45) Date of Patent: Oct. 10, 2023

(54) SEMICONDUCTOR STRUCTURE AND METHOD OF MANUFACTURING THE SAME

(71) Applicant: Taiwan Semiconductor Manufacturing Company Ltd., Hsinchu (TW)

(72) Inventors: Fu-Ting Sung, Taoyuan County (TW); Chung-Chiang Min, Hsinchu County (TW); Yuan-Tai Tseng, Hsinchu County (TW); Chern-Yow Hsu, Hsin-Chu County (TW); Shih-Chang Liu, Kaohsiung County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 1 day.

(21) Appl. No.: 17/305,837

(22) Filed: Jul. 15, 2021

(65) Prior Publication Data
US 2021/0343932 A1    Nov. 4, 2021

Related U.S. Application Data

(60) Continuation of application No. 16/855,792, filed on Apr. 22, 2020, now Pat. No. 11,362,265, which is a
(Continued)

(51) Int. Cl.
*H10N 50/80* (2023.01)
*H01L 27/105* (2023.01)
(Continued)

(52) U.S. Cl.
CPC ............ *H10N 50/80* (2023.02); *H01L 27/105* (2013.01); *H01L 29/40* (2013.01); *H10B 61/22* (2023.02); *H10N 50/01* (2023.02); *H10N 50/10* (2023.02)

(58) Field of Classification Search
CPC .......... G11B 5/3909; G11B 2005/3996; G11B 5/39–3993; H01L 43/08; H01L 43/02;
(Continued)

(56) References Cited

U.S. PATENT DOCUMENTS 8,557,610 B2    10/2013    Chen et al.
8,574,928 B2    11/2013    Satoh et al.
(Continued)

*Primary Examiner* — Julio J Maldonado
*Assistant Examiner* — Stanetta D Isaac
(74) *Attorney, Agent, or Firm* — HAYNES AND BOONE, LLP

(57) ABSTRACT

The present disclosure provides a semiconductor structure, including an $N^{th}$ metal layer, a bottom electrode over the $N^{th}$ metal layer, a magnetic tunneling junction (MTJ) over the bottom electrode, a top electrode over the MTJ, and an $(N+M)^{th}$ metal layer over the $N^{th}$ metal layer. N and M are positive integers. The $(N+M)^{th}$ metal layer surrounds a portion of a sidewall of the top electrode. A manufacturing method of forming the semiconductor structure is also provided.

20 Claims, 20 Drawing Sheets

Related U.S. Application Data continuation of application No. 16/048,457, filed on Jul. 30, 2018, now Pat. No. 10,720,568, which is a division of application No. 15/151,207, filed on May 10, 2016, now Pat. No. 10,454,021.

(60) Provisional application No. 62/288,793, filed on Jan. 29, 2016.

(51) Int. Cl.
| | |
|---|---|
| *H01L 29/40* | (2006.01) |
| *H10B 61/00* | (2023.01) |
| *H10N 50/01* | (2023.01) |
| *H10N 50/10* | (2023.01) |

(58) Field of Classification Search
CPC ............ H01L 43/12; H01L 27/22–228; H03B 15/006; G01R 15/205; G01R 33/09–098; G11C 11/16–161
See application file for complete search history.

(56) References Cited

U.S. PATENT DOCUMENTS

| | | |
|---|---|---|
| 8,796,795 B2 | 8/2014 | Satoh et al. |
| 8,981,502 B2 | 3/2015 | Chen et al. |
| 9,013,045 B2 | 4/2015 | Satoh et al. |
| 9,054,297 B2 | 6/2015 | Nagel et al. |
| 9,564,577 B1 | 2/2017 | Hsu et al. |
| 2003/0203510 A1 | 10/2003 | Hineman et al. |
| 2006/0148234 A1 | 7/2006 | Chen et al. |
| 2008/0003701 A1 | 1/2008 | Chen et al. |
| 2009/0130779 A1 | 5/2009 | Li et al. |
| 2010/0176472 A1 | 7/2010 | Shoji |
| 2011/0049654 A1 | 3/2011 | Li et al. |
| 2012/0205764 A1* | 8/2012 | Chen ............... H01L 27/228 257/422 |
| 2013/0032775 A1 | 2/2013 | Satoh et al. |
| 2013/0032907 A1 | 2/2013 | Satoh et al. |
| 2013/0267042 A1* | 10/2013 | Satoh ............... H01L 27/222 438/3 |
| 2014/0252519 A1 | 9/2014 | Kim et al. |
| 2014/0264668 A1 | 9/2014 | Lee et al. |
| 2015/0171314 A1 | 6/2015 | Li et al. |
| 2015/0364676 A1 | 12/2015 | Guo |
| 2020/0035908 A1* | 1/2020 | Ku ............... H01F 41/34 |

\* cited by examiner

SEMICONDUCTOR STRUCTURE AND METHOD OF MANUFACTURING THE SAME

PRIORITY CLAIM AND CROSS-REFERENCE

The present application is a continuation application of U.S. patent application Ser. No. 16/855,792, filed Apr. 22, 2020, which is a continuation application of U.S. patent application Ser. No. 16/048,457, filed Jul. 30, 2018, which is a divisional application of U.S. patent application Ser. No. 15/151,207, filed May 10, 2016, entitled "SEMICONDUCTOR STRUCTURE AND METHOD OF MANUFACTURING THE SAME," now U.S. Pat. No. 10,454,021, which claims its priority to U.S. provisional Patent Application No. 62/288,793, filed Jan. 29, 2016, all of which are hereby incorporated by reference in their entirety.

BACKGROUND

Semiconductors are used in integrated circuits for electronic applications, including radios, televisions, cell phones, and personal computing devices. One type of well-known semiconductor device is the semiconductor storage device, such as dynamic random access memories (DRAMs), or flash memories, both of which use charges to store information.

A more recent development in semiconductor memory devices involves spin electronics, which combines semiconductor technology and magnetic materials and devices. The spin polarization of electrons, rather than the charge of the electrons, is used to indicate the state of "1" or "0." One such spin electronic device is a spin torque transfer (STT) magnetic tunneling junction (MTJ) device MTJ device includes free layer, tunnel layer, and pinned layer. The magnetization direction of free layer can be reversed by applying a current through tunnel layer, which causes the injected polarized electrons within free layer to exert so-called spin torques on the magnetization of free layer. Pinned layer has a fixed magnetization direction. When current flows in the direction from free layer to pinned layer, electrons flow in a reverse direction, that is, from pinned layer to free layer. The electrons are polarized to the same magnetization direction of pinned layer after passing pinned layer; flowing through tunnel layer; and then into and accumulating in free layer. Eventually, the magnetization of free layer is parallel to that of pinned layer, and MTJ device will be at a low resistance state. The electron injection caused by current is referred to as a major injection.

When current flowing from pinned layer to free layer is applied, electrons flow in the direction from free layer to pinned layer. The electrons having the same polarization as the magnetization direction of pinned layer are able to flow through tunnel layer and into pinned layer. Conversely, electrons with polarization differing from the magnetization of pinned layer will be reflected (blocked) by pinned layer and will accumulate in free layer. Eventually, magnetization of free layer becomes anti-parallel to that of pinned layer, and MTJ device will be at a high resistance state. The respective electron injection caused by current is referred to as a minor injection.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 3 to FIG. 12A are cross sections of a semiconductor structure fabricated in various sequential operations, in accordance with some embodiments of the present disclosure.

FIG. 14 to FIG. 15A are cross sections of a semiconductor structure fabricated in various sequential operations, in accordance with some embodiments of the present disclosure.

DETAILED DESCRIPTION

Figure 1:
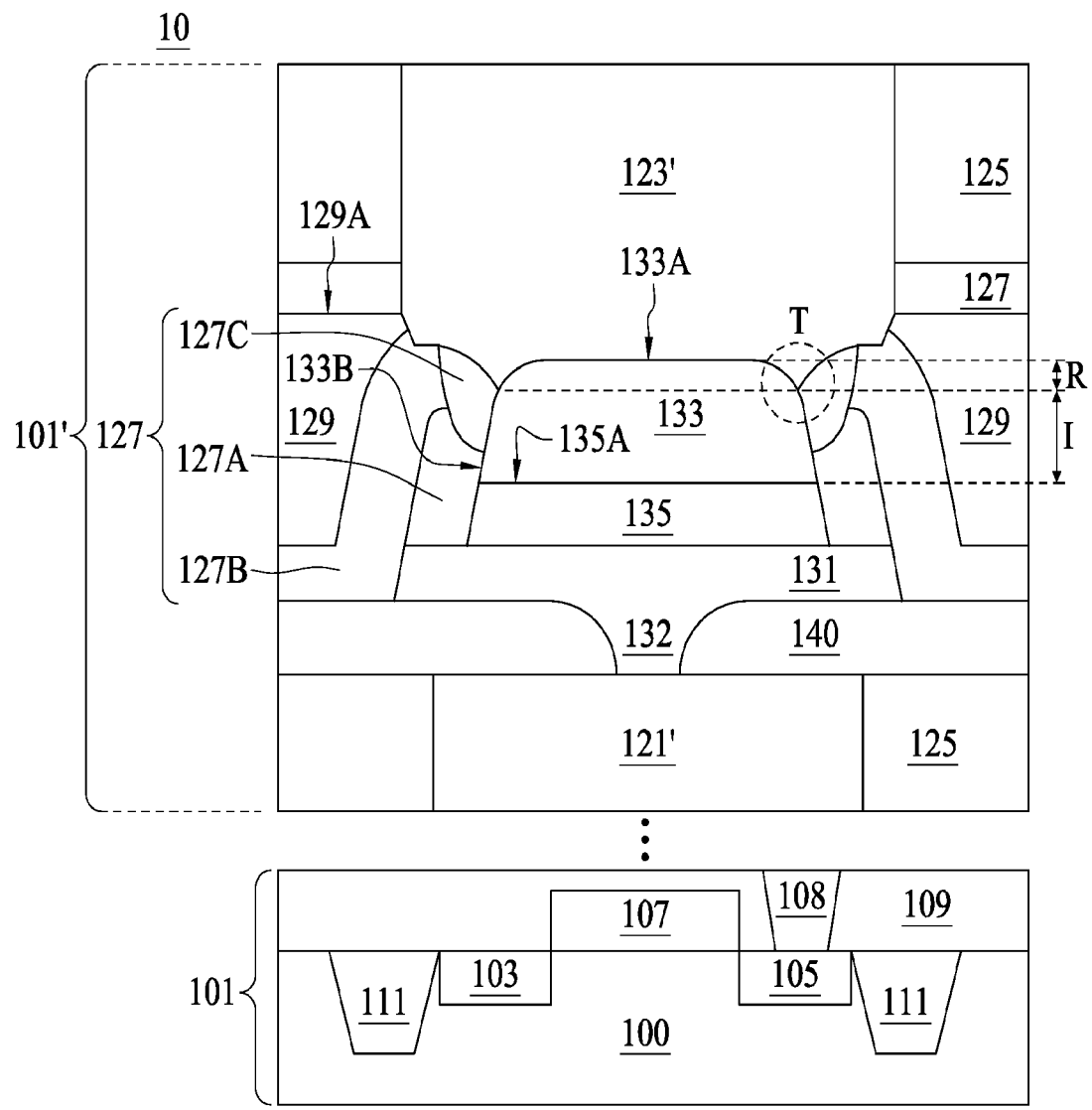
FIG. 1 is a cross section of a semiconductor structure, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the term "about" generally means within 10%, 5%, 1%, or 0.5% of a given value or range. Alternatively, the term "about" means within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

Embedded MRAM cell in a CMOS structure has been continuously developed. A semiconductor circuit with embedded MRAM cell includes an MRAM cell region and a logic region separated from the MRAM cell region. For example, the MRAM cell region may locate at the center of the aforesaid semiconductor circuit while the logic region may locate at a periphery of the semiconductor circuit. Note the previous statement is not intended to be limiting. Other arrangement regarding the MRAM cell region and the logic region are enclosed in the contemplated scope of the present disclosure.

In the MRAM cell region, a transistor structure can be disposed under the MRAM structure. In some embodiments, the MRAM cell is embedded in the metallization layer prepared in a back-end-of-line (BEOL) operation. For example, the transistor structures in the MRAM cell region and in the logic region are disposed in a common semiconductor substrate, prepared in a front-end-of-line operation, and are substantially identical in the aforesaid two regions in some embodiments. The MRAM cell can be embedded in any position of the metallization layer, for example, between adjacent metal line layers distributed horizontally parallel to a surface of the semiconductor substrate. For instance, the embedded MRAM can be located between the $4^{th}$ metal line layer and the $5^{th}$ metal line layer in an MRAM cell region. Horizontally shifted to the logic region, the $4^{th}$ metal line layer is connected to the $5^{th}$ metal line layer though a $4^{th}$ metal via. In other words, taking the MRAM cell region and the logic region into consideration, the embedded MRAM occupies a thickness of at least a portion of the $5^{th}$ metal line layer and the $4^{th}$ metal via. The number provided for the metal line layer herein is not limiting. In general, people having ordinary skill in the art can understand that the MRAM is located between an $N^{th}$ metal line layer and an $(N+1)^{th}$ metal line layer, where N is an integer greater than or equal to 1.

The embedded MRAM includes a magnetic tunneling junction (MTJ) composed of ferromagnetic materials. A bottom electrode and a top electrode are electrically coupled to the MTJ for signal/bias conveyance. Following the example previously provided, the bottom electrode is further connected to the $N^{th}$ metal line layer, whereas the top electrode is further connected to the $(N+1)^{th}$ metal line layer.

Conventional top electrode of an MRAM is manufactured in a non-selective manner. Top electrode of the MRAM is in contact with the $(N+1)^{th}$ metal line layer. After the MTJ layer and the top electrode layer are patterned, a nitride etch stop layer is conformally formed over the patterned MTJ and the patterned top electrode. An inter layer dielectric (ILD) is then formed surrounding the MRAM, followed by an etch back evenly removing the ILD, the nitride etch stop layer, and a top portion of the top electrode until the top electrode is ensured to be exposed after the etch back operation. The aforesaid etch back is a non-selective etch back which evenly remove the ILD, the nitride etch stop layer, and the top electrode, rendering a substantially leveled surfaces for the aforesaid three materials.

During the operation of the non-selective etch back, $CF_4$ gas and other etching gases composed of C, H, and F are adopted in an reactive ion etch (RIE). The top electrode is substantially thinned in a main etch stage to ensure the complete exposure of the top electrode. In this connection, after the $(N+1)^{th}$ metal line layer is formed to contact with the top surface of the top electrode, a distance between the $(N+1)^{th}$ metal line and the MTJ (hereinafter "isolation distance") is too short to the extent that no proper isolation effect can be rendered. For example, when an MTJ has a diameter of 1000 Å from a top view perspective, and the isolation distance thereof is smaller than about 200 Å, the $(N+1)^{th}$ metal line and the MTJ are considered short, affecting the data storage performance of the MRAM.

On the other hand, after the main etch, a subsequent etch stop layer and a low-k dielectric layer is formed for the preparation of the $(N+1)^{th}$ metal line plating. An over etch is conducted after forming the $(N+1)^{th}$ metal line trench using photolithography operations. The over etch is carried out to expose contact interface between the top electrode and the $(N+1)^{th}$ metal line in order to electrically couple the two without sacrificing the isolation effect provided by the top electrode. A distance between the top surface of the top electrode and the lowest portion of the $(N+1)^{th}$ metal line in contact with the sidewall of the top electrode (hereinafter "recess distance") shall be thick enough to render sufficient contact interface for lowering series resistance but thin enough to retain proper isolation distance for preventing electrical short between the $(N+1)^{th}$ metal line and the MTJ.

Adopting the conventional non-selective etch back operation would inevitably thin the total thickness of the top electrode. Under such circumstances, the isolation distance and the recess distance can be a mutually trade-off factor where the increase of the isolation distance is at the expense of the recess distance thus rendering insufficient contact interface; and the increase of the recess distance is at the expense of the isolation distance thus rendering electrical short between the $(N+1)^{th}$ metal line and the MTJ.

The present disclosure provides a semiconductor structure having an MRAM. The thickness of the top electrode of the MRAM is preserved by adopting a selective etch not consuming the top electrode as well as the ILD.

In accordance with some embodiments of the present disclosure, a semiconductor structure is provided to have an $N^{th}$ metal layer, a bottom electrode over the $N^{th}$ metal layer, a magnetic tunneling junction (MTJ) over the bottom electrode, a top electrode over the MTJ, and an $(N+M)^{th}$ metal layer over the $N^{th}$ metal layer. N and M are positive integers. The $(N+M)^{th}$ metal layer surrounds a portion of a sidewall of the top electrode. The top electrode includes a recess region and an isolation region. The recess region is surrounded by the $(N+M)^{th}$ metal layer whereas the isolation region is defined as the region from a top surface of the MTJ to a bottom surface of the recess region, surrounded by a dielectric layer. A ratio of a thickness of the recess region and a thickness of the isolation region is more than about 0.5.

In accordance with some embodiments of the present disclosure, a semiconductor structure is provided to have a logic region and a memory region. The memory region includes an $N^{th}$ metal layer, a bottom electrode over the $N^{th}$ metal layer, a magnetic tunneling junction (MTJ) over the bottom electrode, a top electrode over the MTJ, and an $(N+1)^{th}$ metal layer over the top electrode. N is a positive integer. A thickness of the top electrode is more than about 300 Å.

In accordance with some embodiments of the present disclosure, a manufacturing method of the semiconductor structure described herein is provided.

Referring to FIG. 1A, FIG. 1A is a cross section of a semiconductor structure 10, in accordance with some embodiments of the present disclosure. The semiconductor structure 10 includes a transistor structure 101 and a metallization structure 101'. In some embodiments, the semiconductor substrate 100 of the transistor structure 101 may be but is not limited to, for example, a silicon substrate. In an embodiment, substrate 100 is a semiconductor substrate, such as a silicon substrate, although it may include other semiconductor materials, such as silicon germanium, silicon carbide, gallium arsenide, or the like. In the present embodiment, the semiconductor substrate 100 is a p-type semiconductor substrate (P-Substrate) or an n-type semiconductor substrate (N-Substrate) comprising silicon. Alternatively, the substrate 100 includes another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In yet another alternative, the semiconductor substrate 100 is a semiconductor on insulator (SOI). In other alternatives, semiconductor substrate 100 may include a doped epi layer, a gradient semiconductor layer, and/or a semiconductor layer overlying another semiconductor layer of a different type, such as a silicon layer on a silicon germanium layer. The semiconductor substrate 100 may or may not include doped regions, such as a p-well, an n-well, or combination thereof.

The semiconductor substrate 100 further includes heavily doped regions such as sources 103 and drains 105 at least partially in the semiconductor substrate 100. A gate 107 is positioned over a top surface of the semiconductor substrate 100 and between the source 103 and the drain 107. Contact plugs 108 are formed in inter-layer dielectric (ILD) 109, and may be electrically coupled to the transistor structure 101. In some embodiments, the ILD 109 is formed on the semiconductor substrate 100. The ILD 109 may be formed by a variety of techniques for forming such layers, e.g., chemical vapor deposition (CVD), low-pressure CVD (LPCVD), plasma-enhanced CVD (PECVD), sputtering and physical vapor deposition (PVD), thermal growing, and the like. The ILD 109 above the semiconductor substrate 100 may be formed from a variety of dielectric materials and may, for example, be an oxide (e.g., Ge oxide), an oxynitride (e.g., GaP oxynitride), silicon dioxide ($SiO_2$), a nitrogen-bearing oxide (e.g., nitrogen-bearing $SiO_2$), a nitrogen-doped oxide (e.g., $N_2$-implanted $SiO_2$), silicon oxynitride ($Si_xO_yN_z$), and the like.

FIG. 1 shows a planar transistor having a doped region in the semiconductor substrate 100. However, the present disclosure is not limited thereto. Any non-planar transistor, such as a FinFET structure, can have raised doped regions.

In some embodiments, a shallow trench isolation (STI) 111 is provided to define and electrically isolate adjacent transistors. A number of STI 111 is formed in the semiconductor substrate 100. The STI 111, which may be formed of suitable dielectric materials, may be provided to isolate a transistor electrically from neighboring semiconductor devices such as other transistors. The STI 111 may, for example, include an oxide (e.g., Ge oxide), an oxynitride (e.g., GaP oxynitride), silicon dioxide ($SiO_2$), a nitrogen-bearing oxide (e.g., nitrogen-bearing $SiO_2$), a nitrogen-doped oxide (e.g., $N_2$-implanted $SiO_2$), silicon oxynitride ($Si_xO_yN_z$), and the like. The STI 111 may also be formed of any suitable "high dielectric constant" or "high K" material, where K is greater than or equal to about 8, such as titanium oxide ($Ti_xO_y$, e.g., $TiO_2$), tantalum oxide ($Ta_xO_y$, e.g., $Ta_2O_5$), barium strontium titanate (BST, $BaTiO_3/SrTiO_3$), and the like. Alternatively, the STI 111 may also be formed of any suitable "low dielectric constant" or "low K" dielectric material, where K is less than or equal to about 4.

Referring to FIG. 1, a metallization structure 101' is disposed above the transistor structure 101. Because the $N^{th}$ metal layer 121' may not be the first metal layer over the transistor structure 101, the omission of a portion of the metallization structure 101' is represented by dots. An MRAM structure (132, 131, 135, 133) is disposed between an $N^{th}$ metal line 121' and an $(N+1)^{th}$ metal line 123'. Interconnect structure includes a plurality of metal layers, namely $M_1, M_2 \ldots M_N$. Throughout the description, the term "metal layer" refers to the collection of the metal lines in the same layer. Metal layers $M_1$ through $M_N$ are formed in inter-metal dielectrics (IMDs) 125, which may be formed of oxides such as un-doped Silicate Glass (USG), Fluorinated Silicate Glass (FSG), low-k dielectric materials, or the like. The low-k dielectric materials may have k values lower than 3.8, although the dielectric materials of IMDs 125 may also be close to 3.8. In some embodiments, the k values of the low-k dielectric materials are lower than about 3.0, and may be lower than about 2.5. The $N^{th}$ metal via 122 may be formed by a variety of techniques, e.g., electroplating, electroless plating, high-density ionized metal plasma (IMP) deposition, high-density inductively coupled plasma (ICP) deposition, sputtering, physical vapor deposition (PVD), chemical vapor deposition (CVD), low-pressure chemical vapor deposition (LPCVD), plasma-enhanced chemical vapor deposition (PECVD), and the like.

In FIG. 1, the MRAM structure (132, 131, 135, 133) at least includes a bottom electrode via (BEVA) 132, a bottom electrode 131, a top electrode 133, and an MTJ 135. The BEVA 132 is on the $N^{th}$ metal line 121'. In some embodiments, a planarization operation, such as a chemical mechanical polishing (CMP) operation, may be applied to a top surface of the BEVA 132. In some embodiments, the BEVA 132 trench possesses a trapezoidal recess surrounded by a dielectric stack 140 including SiC and silicon rich oxide (SRO). Alternatively, the SRO can be replaced or combined with Tetraethyl Orthosilicate (TEOS). In some embodiments, the BEVA 132 may include conductive materials such as metal. The bottom electrode 131 may comprise TiN, TaN, W, Al, Ni, Co, Cu or the combination thereof. In some embodiments, a planarization operation, such as a CMP operation, may be applied to a top surface of the bottom electrode 131. In some embodiments, the material of the bottom electrode 131 is different from that of the BEVA 132. In some embodiments, the thickness of the bottom electrode 131 is in a range from about 100 Å to about 400 Å.

The MTJ 135 is on the bottom electrode 131. As shown in FIG. 1, a sidewall of the MTJ 135 is protected by a dielectric layer 127 such as a nitride layer. The top electrode 133 is disposed on the MTJ 135. In some embodiments, the top electrode 133 may include nitrides such as TiN, TaN, Ta or Ru. In some embodiments, the top electrode 133 and the bottom electrode 131 are made of a same material. In some embodiments, the material of the top electrode 133 is different from that of the BEVA 132 and the bottom electrode 131.

In FIG. 1, the $(N+1)^{th}$ metal line 123' is surrounded by dielectric layer 127 in addition to the IMDs 125. In some embodiments, the dielectric layer 127 includes silicon nitrides. In some embodiments, the dielectric layer 127 includes an SRO layer and an SiC layer, surrounding the $(N+1)^{th}$ metal line 123'. As shown in FIG. 1, the dielectric layer 127 includes a first dielectric layer 127A, a second dielectric layer 127B, and a third dielectric layer 127C. The first, the second, and the third dielectric layers may be composed of same material such as silicon nitride. Since the first, the second, and the third dielectric layers are formed at different deposition operations, interfaces between each of the dielectric layers can be observed.

In some embodiments, the BEVA 132 of the MRAM structure is electrically coupled with the doped region. In some embodiments, the doped region is a drain 105 or a source 103. In other embodiments, the BEVA 132 of the MRAM structure 130 is electrically coupled with the gate 107. In some embodiments, the gate 107 of the semiconductor structure 10 can be a polysilicon gate or a metal gate.

As shown in FIG. 1, the $(N+1)^{th}$ metal line 123' is in contact with the top surface 133A as well as a portion of the sidewall 133b of the top electrode 133. In some embodiments, the top electrode 131 includes a recess region extending from the top surface 133A to a lowest point of the $(N+1)^{th}$ metal line 123', possessing a recess distance R. The top electrode 131 also includes an isolation region from the bottom of the recess region to a top surface 135A of the MTJ 135, possessing an isolation distance I. In some embodiments, a ratio of the recess distance R and the isolation distance I is more than about 0.5. That is, the recess thickens R is at least half of the isolation distance I. Given the above discussion, compared to the conventional top electrode, the increase of the recess distance R of the semiconductor structure 10 does not affect the isolation effect provided by the isolation region.

In some embodiments, the recess distance R is in a range of from about 50 Å to about 150 Å. Conventionally a recess distance R in the aforesaid range would render insufficient isolation between the $(N+1)^{th}$ metal line and the MTJ because the total thickness of the top electrode prepared conventionally is thinner than that using the manufacturing method described herein. For example, the total thickness of the top electrode, i.e., the summation of the isolation distance I and the recess distance R, is more than about 300 Å. In some embodiments, the isolation distance I is at least about 200 Å given a diameter D of the MTJ 135 from a top view perspective shown in FIG. 15C to be about 1000 Å. In other words, a ratio of the diameter D and the isolation distance I for some embodiments of the present disclosure is about 5. This ratio guarantees proper isolation between the $(N+1)^{th}$ metal line and the MTJ. Preferably, the aforesaid D/I ratio is smaller than about 5.

Referring to FIG. 1, an inter metal dielectric (IMD) or a dielectric layer 129 further surrounds the dielectric layer 127. In some embodiments, the dielectric layer 129 is composed of oxides different from the nitrides of the dielectric layer 127. In some embodiments, the dielectric layer 129 includes TEOS. As shown in FIG. 1, a top surface 129A of the dielectric layer 129 is higher than the top surface 133A of the top electrode 133. Compared to the non-selective main etch to the top electrode 133, the semiconductor structure 10 provided in the present disclosure adopts selective over etch to expose the top surface 133A of the top electrode 133. The selective etchants substantially do not consume any of the dielectric layer 129 and the top electrode 133. Hence, the dielectric layer 129 and the top electrode 133 can retain its original thickness as deposited. In this connection, the dielectric layer 129 possesses a top surface 129A higher than that of the top electrode 133.

Figure 2:
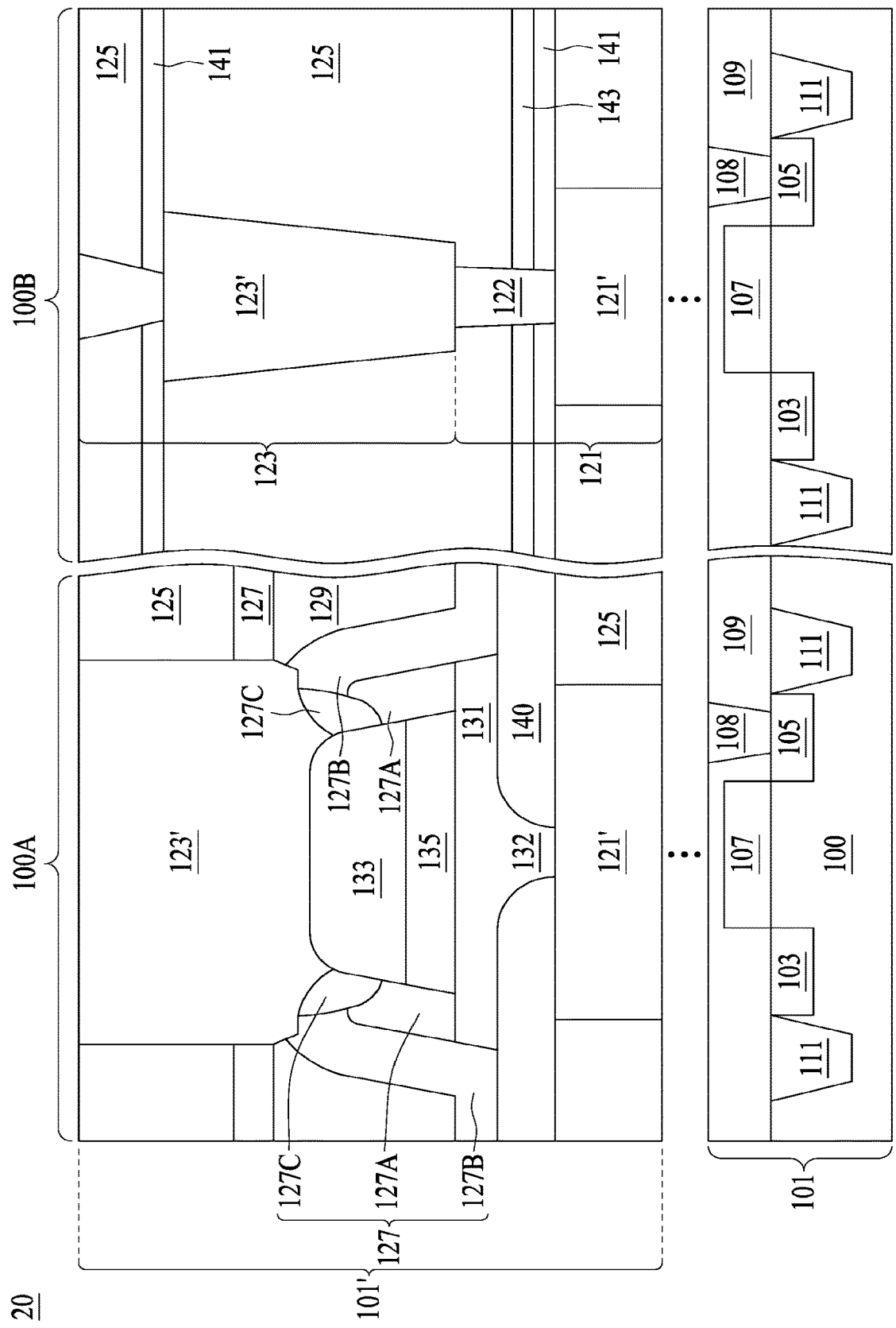
FIG. 2 is a cross section of a semiconductor structure, in accordance with some embodiments of the present disclosure.

Referring to FIG. 2, the semiconductor structure 20 can be a semiconductor circuit including a MRAM cell region 100A and a logic region 100B. Each of the MRAM cell region 100A and the logic region 100B has a transistor structure 101 in a semiconductor substrate 100. In some embodiments, the transistor structures 101 are substantially identical in the MRAM cell region 100A and in the logic region 100B. Details of the MRAM cell region 100A can be referred to the description of FIG. 1A and FIG. 1B. In the logic region 100B, the $N^{th}$ metal line 121' is connected to the $(N+1)^{th}$ metal line 123' by an $N^{th}$ metal via 122 of the $N^{th}$ metal layer 121. In some embodiments, the metal lines and metal vias are filled with electrically conductive material, e.g. copper, gold or another suitable metal or alloy, to form a number of conductive vias. Metal lines and metal vias in different metal layers form an interconnect structure composed of substantially pure copper (for example, with a weight percentage of copper being greater than about 90 percent, or greater than about 95 percent) or copper alloys, and may be formed using the single and/or dual damascene operations. Metal lines and metal vias may be, or may not be, substantially free from aluminum. Comparing the MRAM cell region 100A and the logic region 100B, a thickness of the MRAM structure 130 is substantially equal to a sum of the thickness T2 of the $N^{th}$ metal via 122 and the thickness T1 of a portion of $(N+1)^{th}$ metal line 123'. In some embodiments, the metal line 123' may be the $(N+M)^{th}$ metal line 123', where M can be any integers greater than 1. In some embodiments, the $N^{th}$ metal line 121' is the fourth metal line and the $(N+M)^{th}$ metal line 123' is the fifth metal line.

Figure 3:
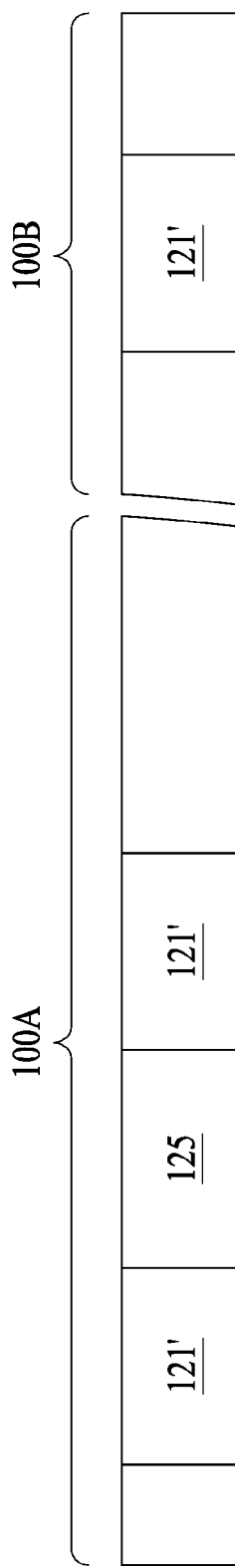

FIG. 3 to FIG. 15B and FIG. 16 are cross-sectional views of a semiconductor structure fabricated at various operations, in accordance with some embodiments of the present disclosure. In FIG. 3, a semiconductor structure having a predetermined MRAM cell region 100A and a logic region 100B is provided. In some embodiments, a transistor structure is pre-formed in a semiconductor substrate (not shown in FIG. 3). The integrated circuit device may undergo further CMOS or MOS technology processing to form various features known in the art. For example, one or more contact plugs, such as silicide regions, may also be formed. The contact features may be coupled to the source and drain. The contact features comprise silicide materials, such as nickel silicide (NiSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), cobalt silicide (CoSi), other suitable conductive materials, and/or combinations thereof. In an example, the contact features are formed by a salicide (self-aligned silicide) operation.

An $N^{th}$ metal line 121' is patterned in a dielectric layer 125 over the transistor structure. In some embodiments, the $N^{th}$ metal line 121' can be formed of an electroplating operation with a Cu seed layer deposited over the patterned dielectric layer 125. In other embodiments, the $N^{th}$ metal line 121' may be formed by a variety of techniques, e.g., electroless plating, high-density ionized metal plasma (IMP) deposition, high-density inductively coupled plasma (ICP) deposition, sputtering, physical vapor deposition (PVD), chemical vapor deposition (CVD), low-pressure chemical vapor deposition (LPCVD), plasma-enhanced chemical vapor deposition (PECVD), and the like. A planarization operation is performed to expose a top surface of the $N^{th}$ metal line 121' and the top surface of the dielectric layer 125.

Figure 4:
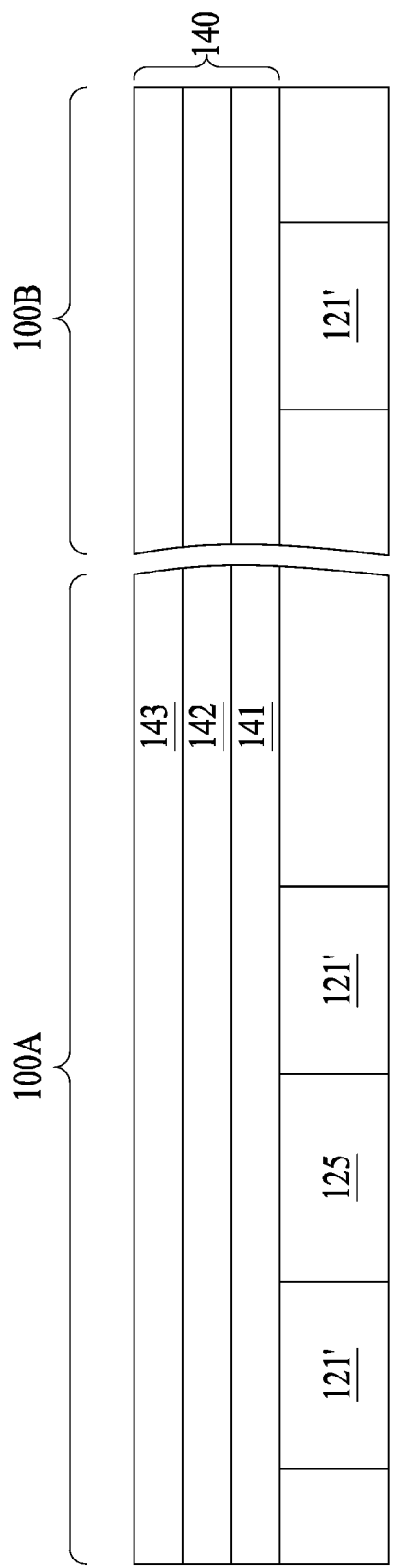

In FIG. 4, a dielectric layer 140 in a form of a dielectric stack including a SiC layer 141, a TEOS/SRO layer 142, and a SiC layer 141 are blanket deposited over a top surface of the $N^{th}$ metal line 121' and a top surface of the dielectric layer 125, in both the MRAM cell region 100A and the logic region 100B. The dielectric layer 140 can be formed by a variety of techniques, e.g., chemical vapor deposition (CVD), low-pressure CVD (LPCVD), plasma-enhanced CVD (PECVD), sputtering and physical vapor deposition (PVD), thermal growing, and the like.

Figure 5:
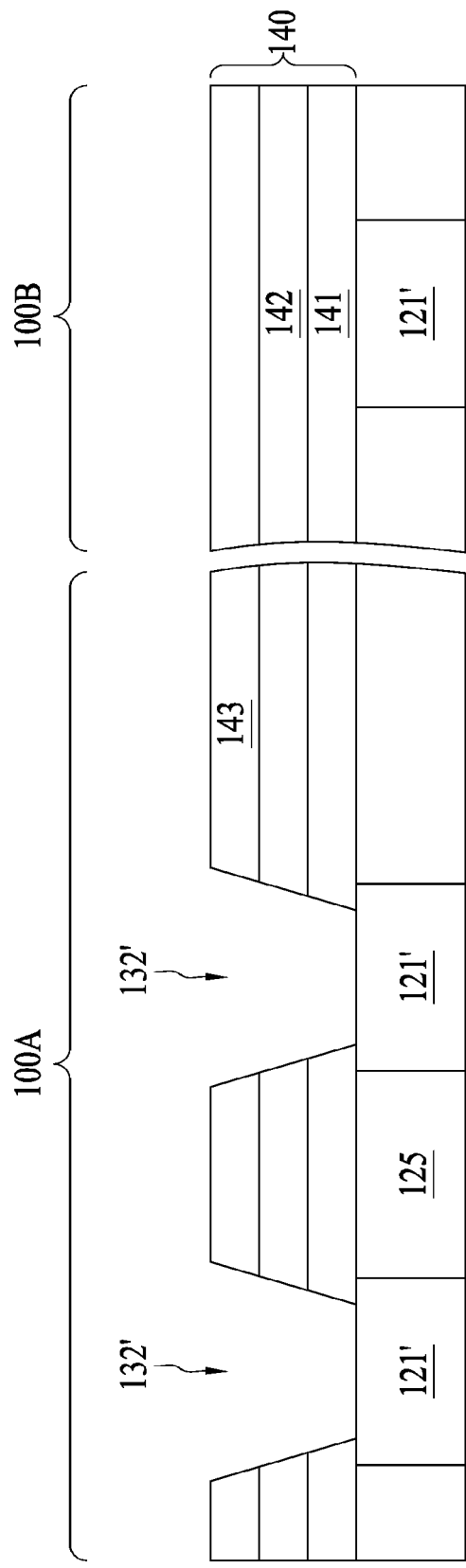

In FIG. 5, a photoresist layer (not shown) is patterned over the dielectric layer 140 to expose a BEVA hole 132' of the MRAM structure. As shown in FIG. 5, two BEVA holes 132' are formed in the dielectric layer 140 by a suitable dry etch operation. In some embodiments, the dry etch in the present operation includes reactive ion etch (RIE) adopting fluorine-containing gases. In some embodiments, the present dry etch operation can be any suitable dielectric etch to form via trenches in a metallization structure of conventional CMOS technology. Referring to the logic region 100B as shown in FIG. 5, the dielectric layer 140 is protected by the photoresist layer (not shown) such that a top surface of the $N^{th}$ metal layer 121' is not exposed as opposed to the counterpart in the MRAM cell region 100A.

Figure 6:
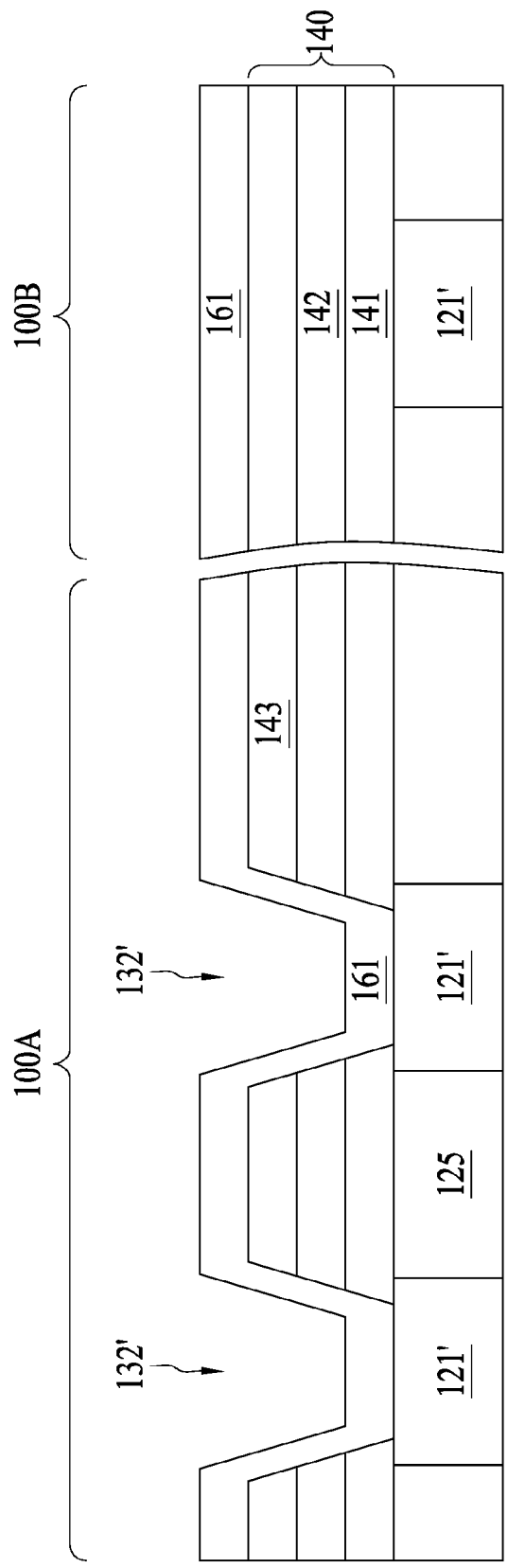
Figure 7:
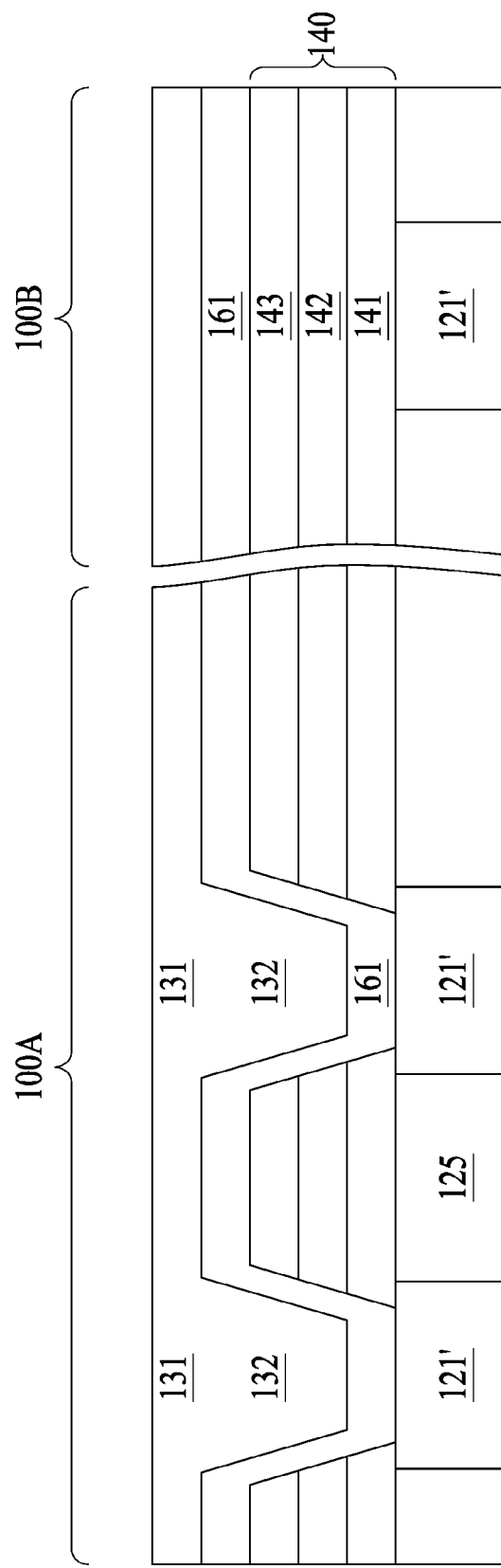

In FIG. 6, a lining layer 161 is blanket lined over the BEVA holes 132' in the MRAM cell region 100A and over the dielectric layer 140 in the logic region 100B. Subsequently, in FIG. 7, a deposition of BEVA material 132 is conducted to be disposed over the lining layer 161 and the dielectric layer 140. In some embodiments, a overfilling of the BEVA material 132 is carried out. The portion overfills the BEVA holes 132' can be a bottom electrode 131 of the MRAM. In some embodiments, the BEVA material 132 includes TiN, TaN, W, Al, Ni, Ta, Ru, Co, Cu or the combination thereof, deposited by a variety of techniques, e.g., high-density ionized metal plasma (IMP) deposition, high-density inductively coupled plasma (ICP) deposition, sputtering, physical vapor deposition (PVD), chemical vapor deposition (CVD), low-pressure chemical vapor deposition (LPCVD), plasma-enhanced chemical vapor deposition (PECVD), and the like.

Figure 8:
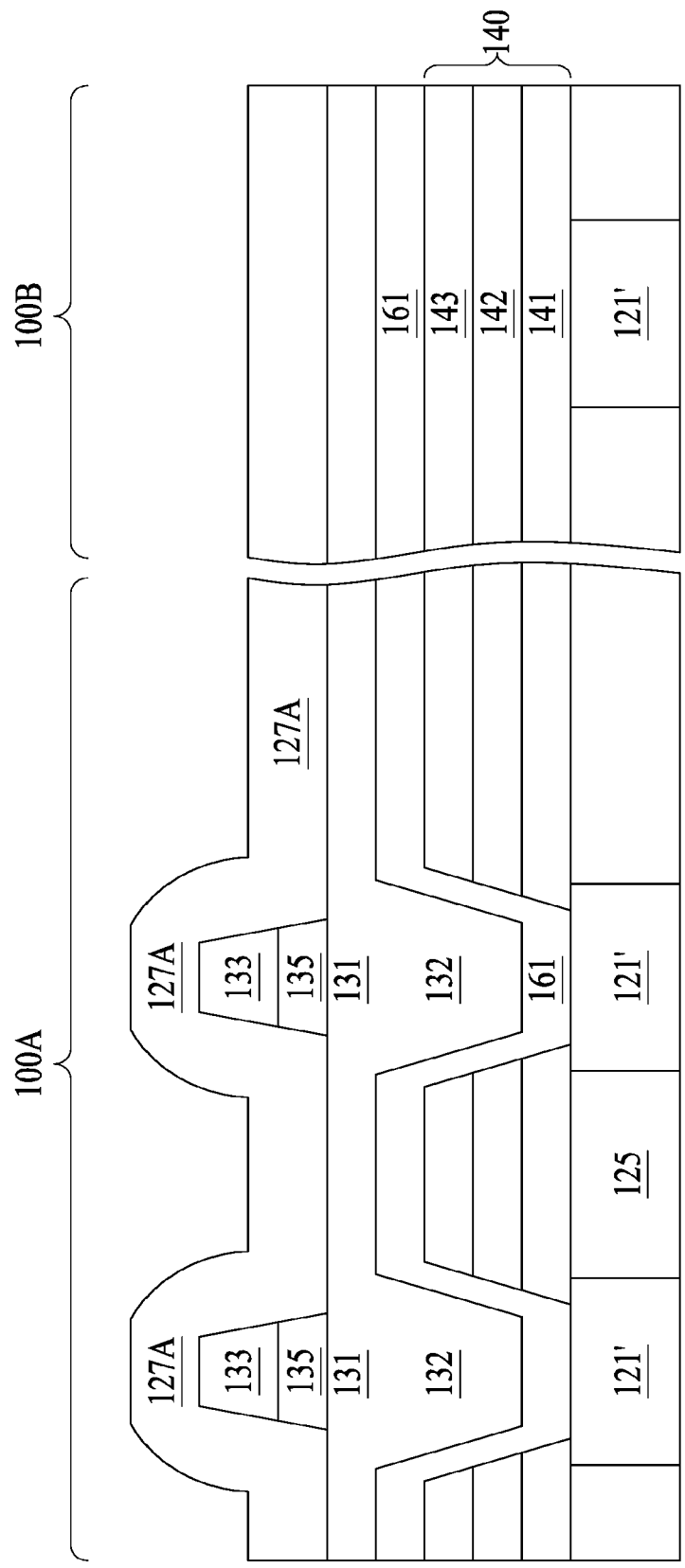

In FIG. 8, an MTJ layer is deposited in a form of multiple material stacks (not illustrated in FIG. 8) over the bottom electrode 131. In some embodiments, the MTJ layer has a thickness in a range from about 150 Å to about 250 Å. The MTJ layer may be formed by variety of techniques, e.g., high-density ionized metal plasma (IMP) deposition, high-density inductively coupled plasma (ICP) deposition, sputtering, physical vapor deposition (PVD), chemical vapor deposition (CVD), low-pressure chemical vapor deposition (LPCVD), plasma-enhanced chemical vapor deposition (PECVD), and the like. In some embodiments, the MTJ 135 may include ferromagnetic layers, spacers, and a capping layer. The capping layer is formed on the ferromagnetic layer. Each of the ferromagnetic layers may include ferromagnetic material, which may be metal or metal alloy, for example, Fe, Co, Ni, CoFeB, FeB, CoFe, FePt, FePd, CoPt, CoPd, CoNi, TbFeCo, CrNi or the like. The spacer may include non-ferromagnetic metal, for example, Ag, Au, Cu, Ta, W, Mn, Pt, Pd, V, Cr, Nb, Mo, Tc, Ru or the like. Another spacer may also include insulator, for example, $Al_2O_3$, MgO, TaO, RuO or the like. The capping layer may include non-ferromagnetic material, which may be a metal or an insulator, for example, Ag, Au, Cu, Ta, W, Mn, Pt, Pd, V, Cr, Nb, Mo, Tc, Ru, Ir, Re, Os, $Al_2O_3$, MgO, TaO, RuO or the like. The capping layer may reduce write current of its associated MRAM cell. The ferromagnetic layer may function as a free layer whose magnetic polarity or magnetic orientation can be changed during write operation of its associated MRAM cell. The ferromagnetic layers and the spacer may function as a fixed or pinned layer whose magnetic orientation may not be changed during operation of its associated MRAM cell. It is contemplated that the MTJ layer may include an antiferromagnetic layer in accordance with other embodiments.

Following the formation of the MTJ layer, a top electrode layer is deposited over the MTJ layer. The top electrode layer may be formed by a variety of techniques, e.g., high-density ionized metal plasma (IMP) deposition, high-density inductively coupled plasma (ICP) deposition, sputtering, physical vapor deposition (PVD), chemical vapor deposition (CVD), low-pressure chemical vapor deposition (LPCVD), plasma-enhanced chemical vapor deposition (PECVD), and the like. In some embodiments, the top electrode layer comprises TiN, TaN, Ta or Ru.

Referring to FIG. 8, a mask layer (not shown) is formed over the top electrode layer for the ensuing MRAM structure formation. The mask layer may have a multi-layer structure, which may include, for example, an oxide layer, an advanced patterning film (APF) layer and an oxide layer. Each of the oxide layer, the APF layer, and the oxide layer may be formed by a variety of techniques, e.g., high-density ionized metal plasma (IMP) deposition, high-density inductively coupled plasma (ICP) deposition, sputtering, physical vapor deposition (PVD), chemical vapor deposition (CVD), low-pressure chemical vapor deposition (LPCVD), plasma-enhanced chemical vapor deposition (PECVD), and the like. In some embodiments, the mask layer is configured to pattern the MTJ layer to form the MTJ 135, the top electrode layer to form the top electrode 133. In some embodiments, the MTJ 135 and the top electrode 133 are formed by an RIE to have a trapezoidal shape viewing from a cross section.

Figure 9:
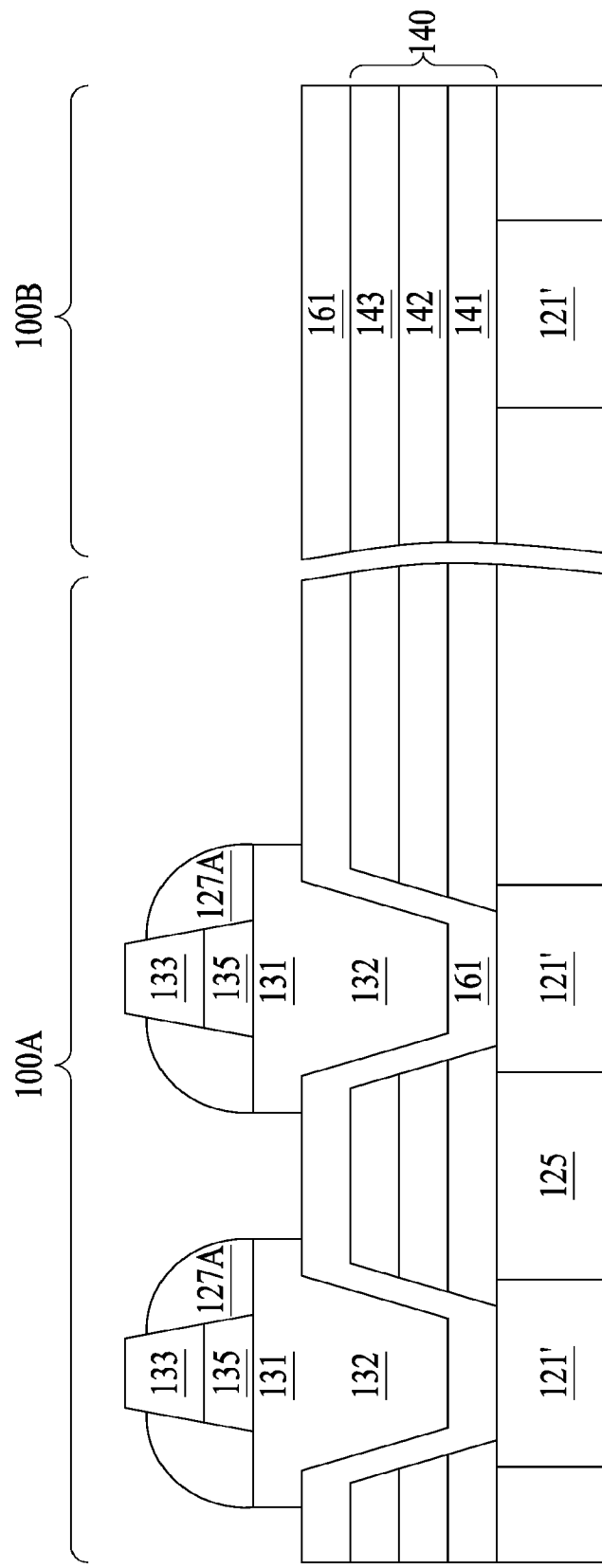

Subsequently, the first dielectric layer 127A possesses a thickness of from about 50 Å to about 300 Å is formed over the MTJ 135 and the top electrode 133. Note a sidewall of the MTJ 135 and the sidewall of the top electrode 133 are surrounded by the first dielectric layer 127A to prevent oxidation or other contamination. Then, as shown in FIG. 9, the first dielectric layer 127A is patterned to expose a top surface of the top electrode 133 and a portion of the bottom electrode 131. The bottom electrode 131 is etched and patterned so that two adjacent MRAMs are electrically decoupled.

Figure 10:
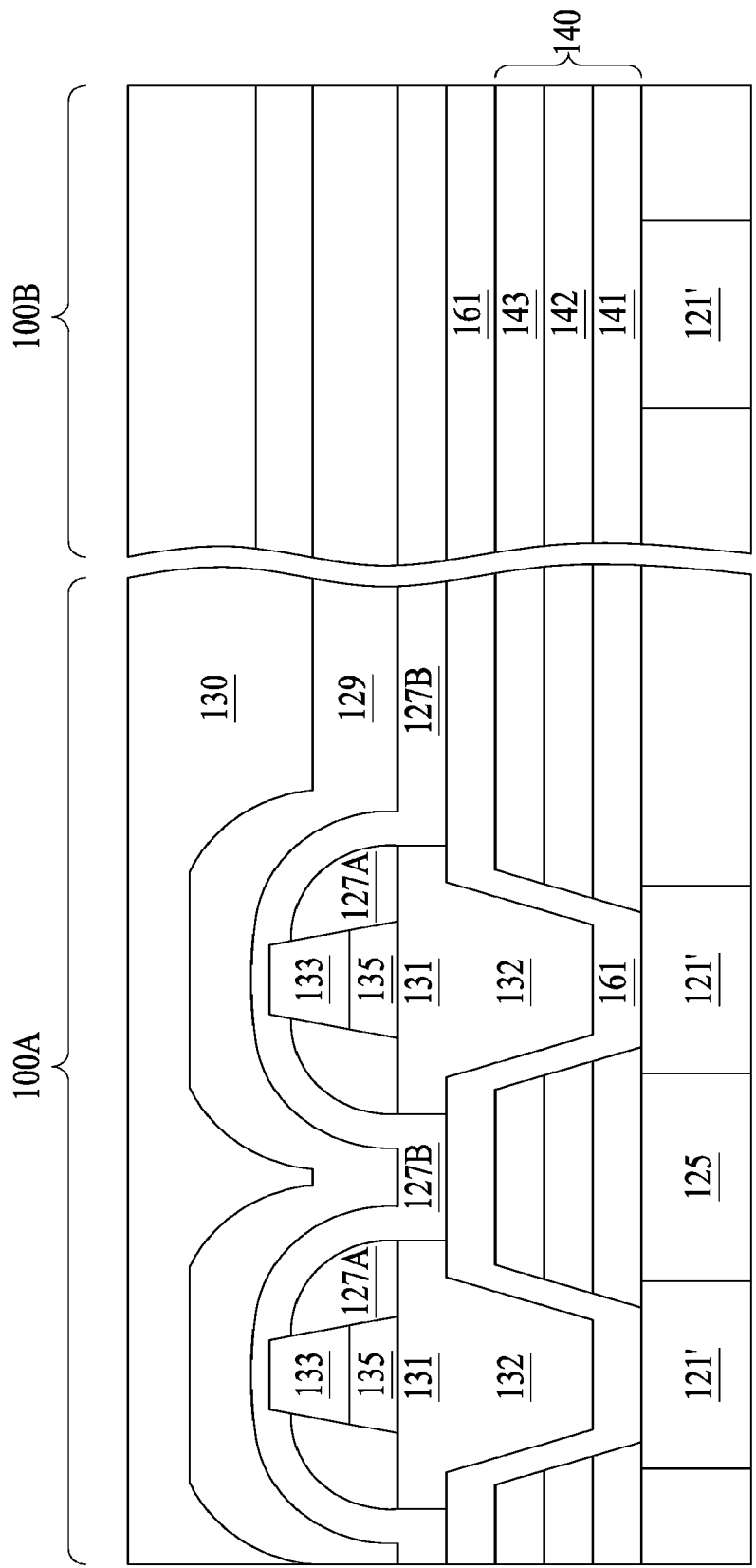

In FIG. 10, a second dielectric layer 127B is conformally deposited over the first dielectric layer 127A, the top electrode 133, and the lining layer 161. In some embodiments, the second dielectric layer 127B is composed of the same materials such as nitrides as the first dielectric layer 127A. A dielectric layer 129 is further formed to conformally cover the second dielectric layer 127B. Optionally, an antireflection layer 130 is leveled over the dielectric layer 129 to facilitate the following photolithography operation.

Figure 11:
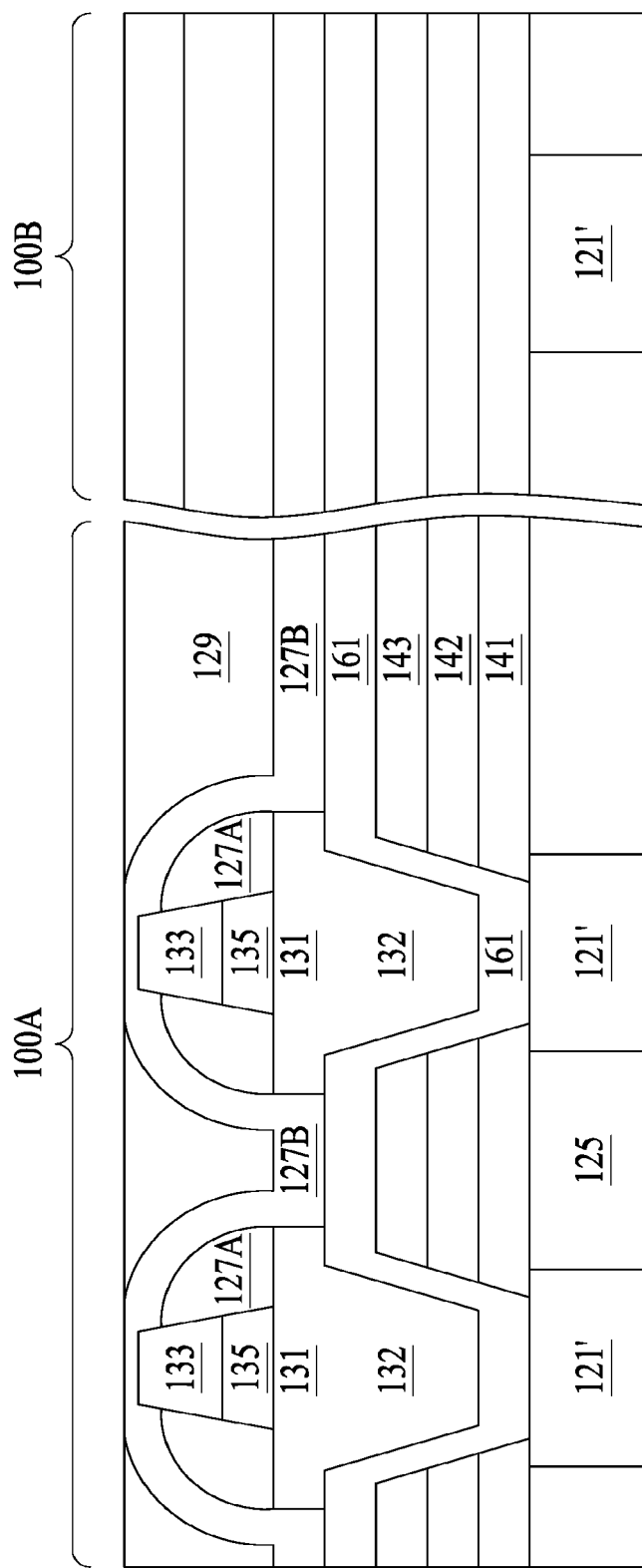

In FIG. 11, a planarization operation is performed on the antireflection layer 130 and the dielectric layer 129 such that the top surface of the dielectric layer 129 is substantially flat across the MRAM cell region 100A and the logic region 100B. As shown in FIG. 11, a non-selective etch is adopted to remove the dielectric layer 129, the antireflection layer 130, and the second dielectric layer 127B using $CF_y$-based etchant chemistry. y is a positive integer. For example, $CF_y$-based etchant chemistry includes $CF_y$ and other etching gas composed of C, H, and F. In some embodiments, the $CF_y$-based etchant chemistry has a $C_nH_lF_m:CF_y$ volume ratio in a range of from 0 to about 0.1. In some embodiments, the non-selective etch is carried out under 0% to 5% of oxygen gas flow with respect to total gas flow. The non-selective etch is performed by end point detection mode so as to stop upon the exposure of the second dielectric layer 127B. Alternatively stated, at the completion of the non-selective etch, the top surface 133A of the top electrode 133 is not exposed.

Figure 12A:
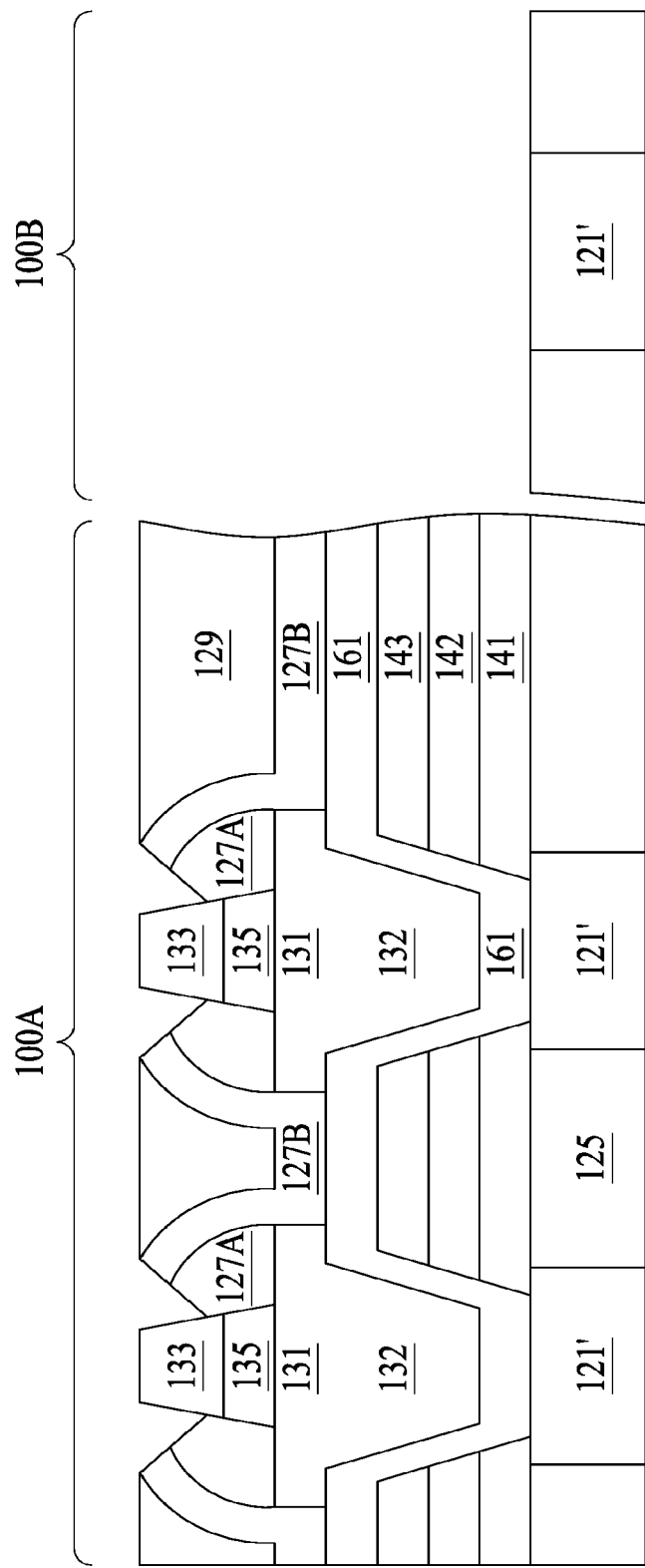
Figure 12B:
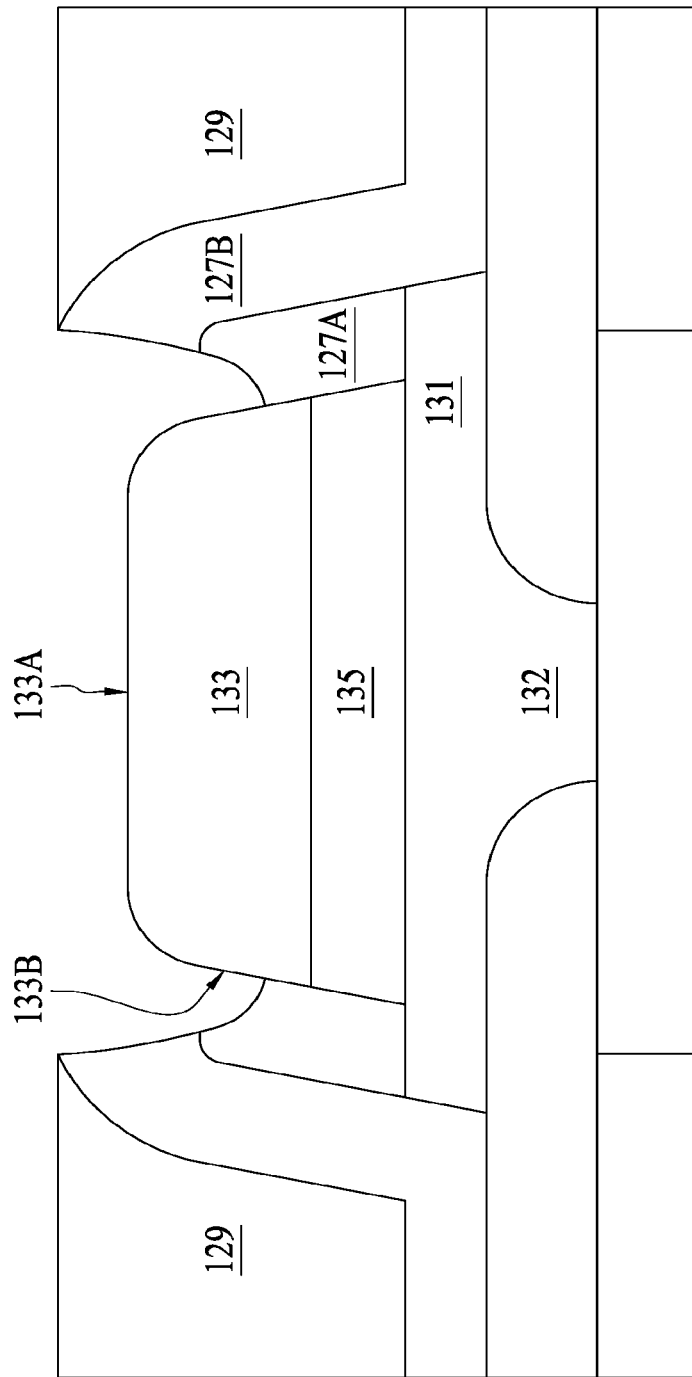
FIG. 12B is a cross section of an enlarged portion of the semiconductor structure of FIG. 12A, in accordance with some embodiments of the present disclosure.

FIG. 12B is a cross section of an enlarged portion of the semiconductor structure of FIG. 12A. In FIG. 12A, a selective etch is adopted to remove a portion of the second dielectric layer 127B and a portion of the first dielectric layer 127A using $C_nH_lF_m$-based etchant chemistry. n, l, m are positive integers. For example, $C_nH_lF_m$-based etchant chemistry includes $C_nH_lF_m$ and other etching gas composed of C and F. In some embodiments, the $C_AH_lF_m$-based etchant chemistry has a $CF_y:C_nH_lF_m$ volume ratio in a range of from 0 to about 0.1. In some embodiments, the selective etch is carried out under 0% to 10% of oxygen gas flow with respect to total gas flow. In some embodiments, the $C_nH_lF_m$ includes $CH_2F_2$, $CHF_3$, and $CH_3F$. In FIG. 12B, the result of the selective removal of the first dielectric layer 127A and the second dielectric layer 127B is enlarged. After the selective etch, the top electrode 133 and the dielectric layer 129 retain their original thickness as the selective etchant chemistry consumes the aforesaid two materials in a very low rate.

Note the top surface 133A and the sidewall 133B of the top electrode 133 is exposed after the selective etch. However, the selective etch is controlled to not expose the sidewall of the MTJ 135. Note in FIG. 11 and FIG. 12A, the dielectric stack is removed in the logic region 100B by proper photolithography operations.

Figure 13A:
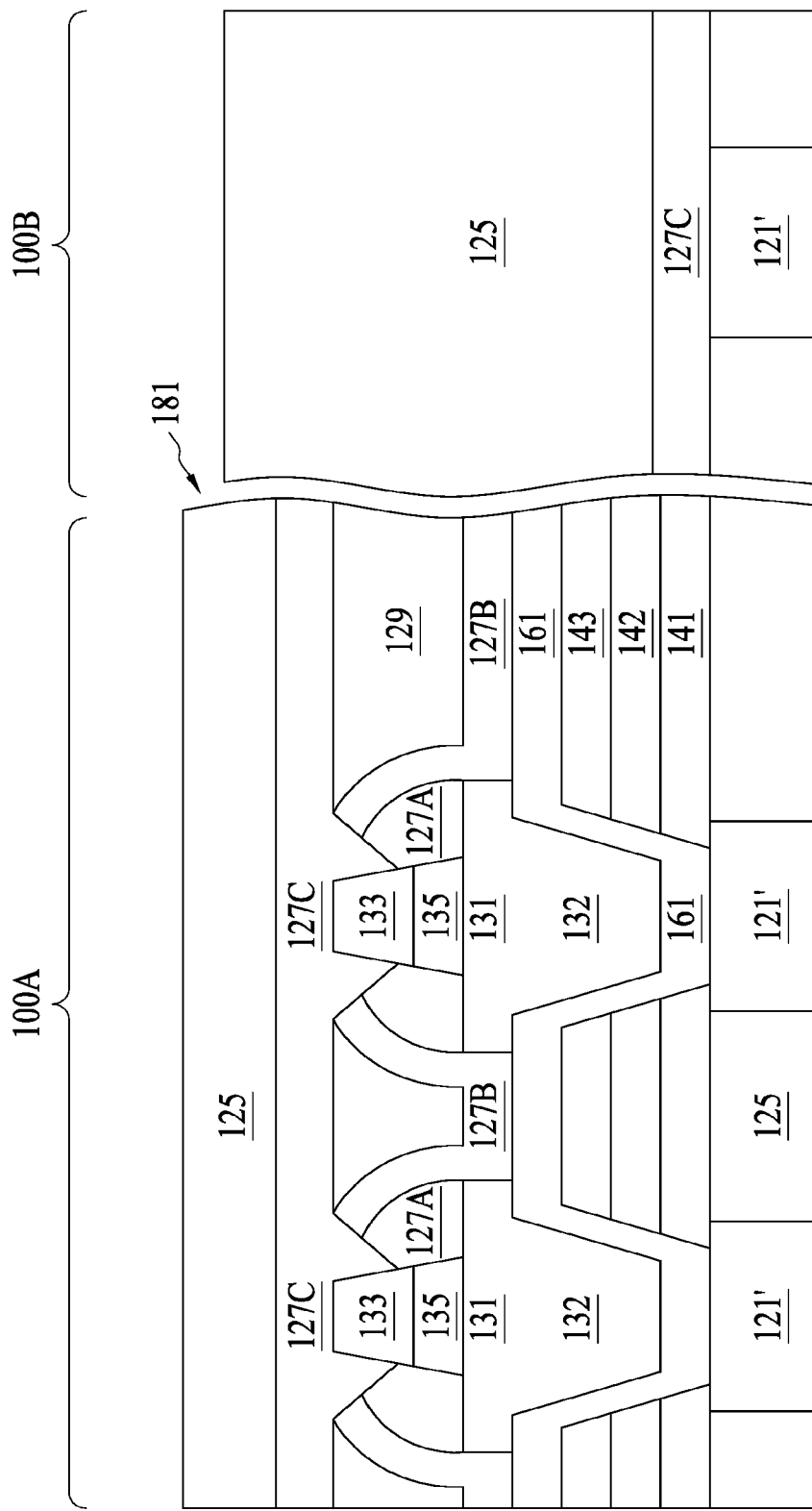
FIG. 13A is a cross section of a semiconductor structure fabricated in one operation, in accordance with some embodiments of the present disclosure.
Figure 13B:
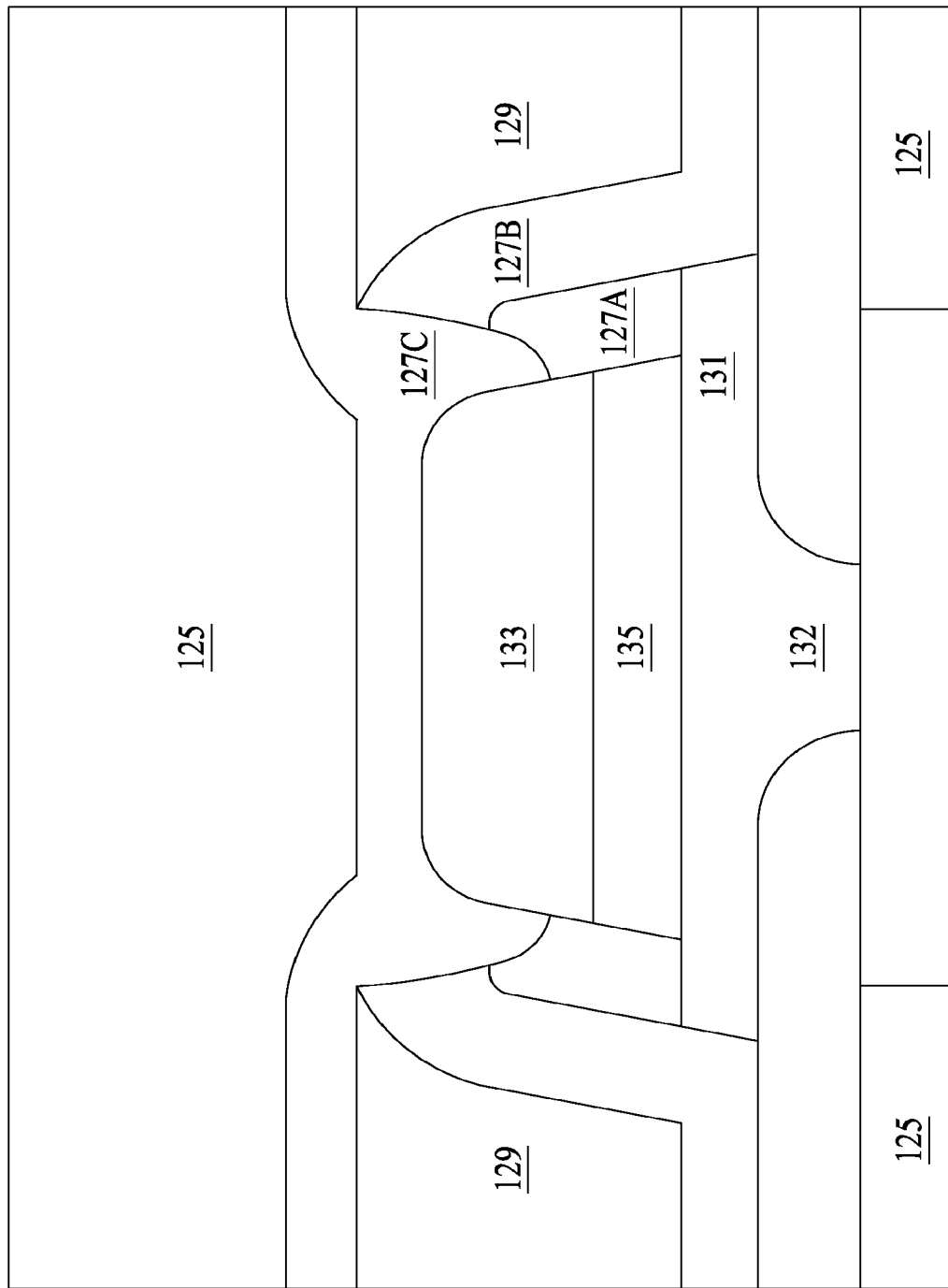
FIG. 13B is a cross section of an enlarged portion of the semiconductor structure of FIG. 13A, in accordance with some embodiments of the present disclosure.

FIG. 13B is a cross section of an enlarged portion of the semiconductor structure of FIG. 13A. In FIG. 13A, a third dielectric layer 127C is formed to fill the recess produced in the aforesaid selective etch. The third dielectric layer 127C also covers a top surface of the dielectric layer 129. As shown in FIG. 13A, the third dielectric layer 127C covers the top surface and sidewalls of the top electrode 133. An IMD or a low-k dielectric layer 125 is formed over the MRAM cell region 100A and the logic region 100B. A step difference 181 can be observed in FIG. 13A, therefore, an etch back operation can be optionally performed to obtain a substantially flat top surface for the following trench formation in both the MRAM cell region 100A and the logic region 100B. The low-k dielectric layer 125 is deliberately kept to act as a protection layer for the subsequent trench formation. The low-k dielectric layer 125 can prevent the acidic solution from damaging the low k dielectric layer during a photoresist stripping operation.

In FIG. 13B, the deposition of the third dielectric layer 127C after the selective etch is enlarged for further description. As shown in FIG. 13B, an interface between the first dielectric layer 127A and the second dielectric layer 127B, as well as an interface between the aforesaid two dielectric layer and the third dielectric layer 127C can be observed from the cross section because these dielectric layers are deposited in different operations. The top surface 133A and a portion of the sidewall 133B of the top electrode 133 is again covered by the dielectric layer (i.e., the third dielectric layer 127C), followed by the low-k dielectric layer 125 formation.

Figure 14:
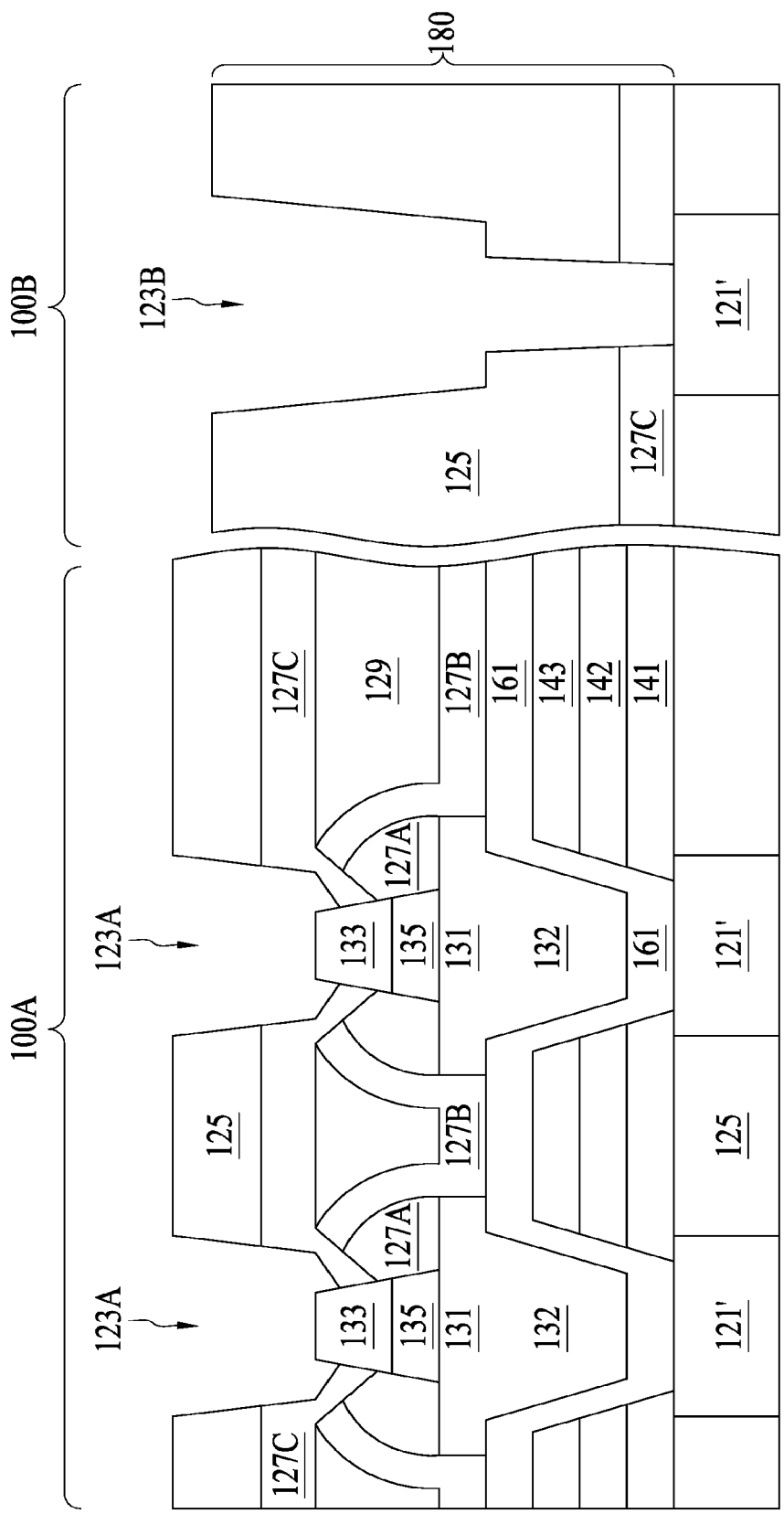

In FIG. 14, photoresist (not shown) is patterned over the planarized dielectric surface to form trenches for metal lines and metal via. For example, in the MRAM cell region 100A, a $(N+1)^{th}$ metal line trench 123A is formed over the MRAM structure 130, exposing the top surface and a portion of the sidewall of the top electrode 133 of the MRAM. In the logic region 100B, an $N^{th}$ metal via trench and an $(N+1)^{th}$ metal line trench (combinatory 123B) is formed over the $N^{th}$ metal line 121', exposing a top surface of the Na metal line 121'.

Figure 15A:
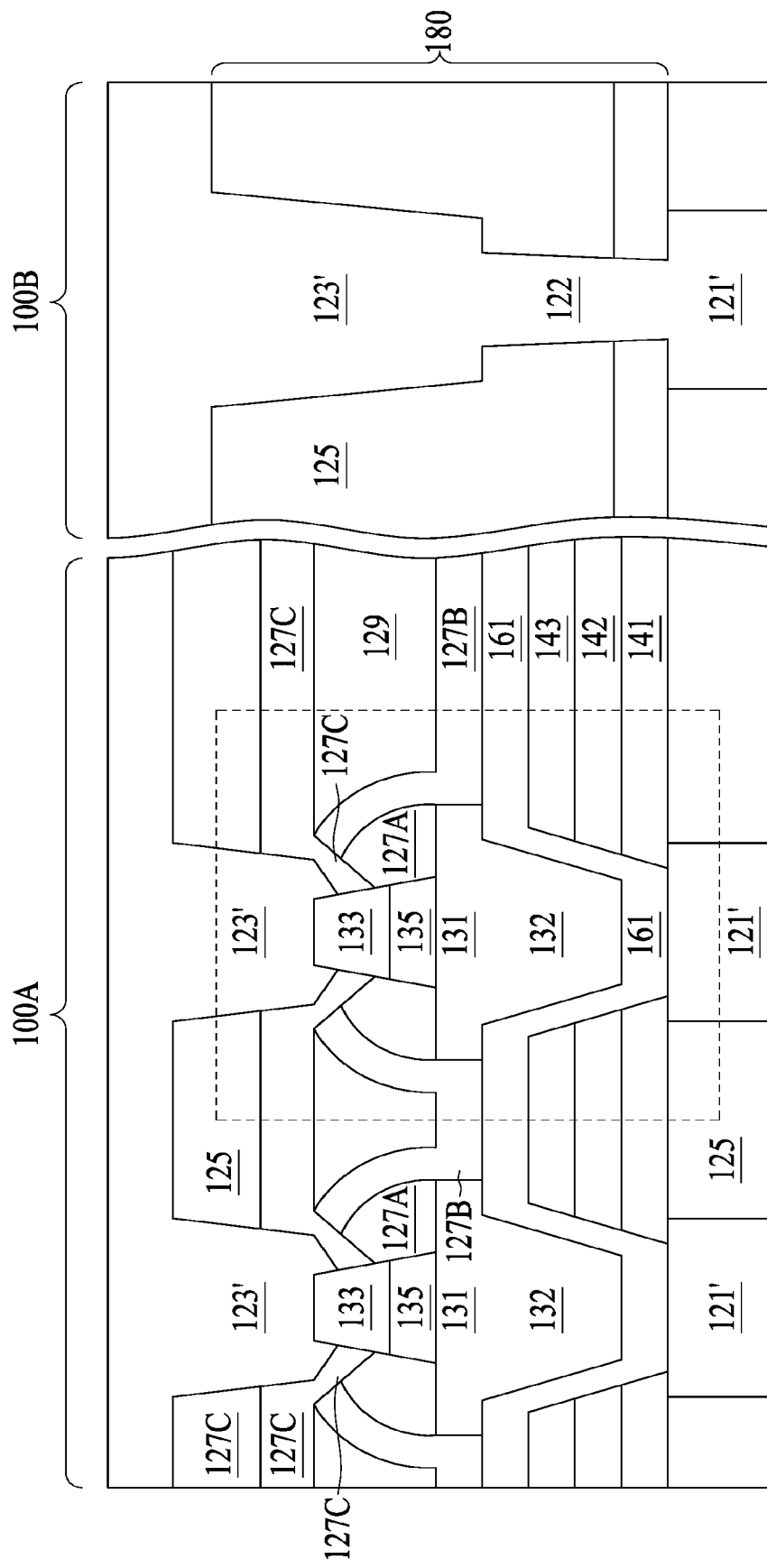
Figure 15B:
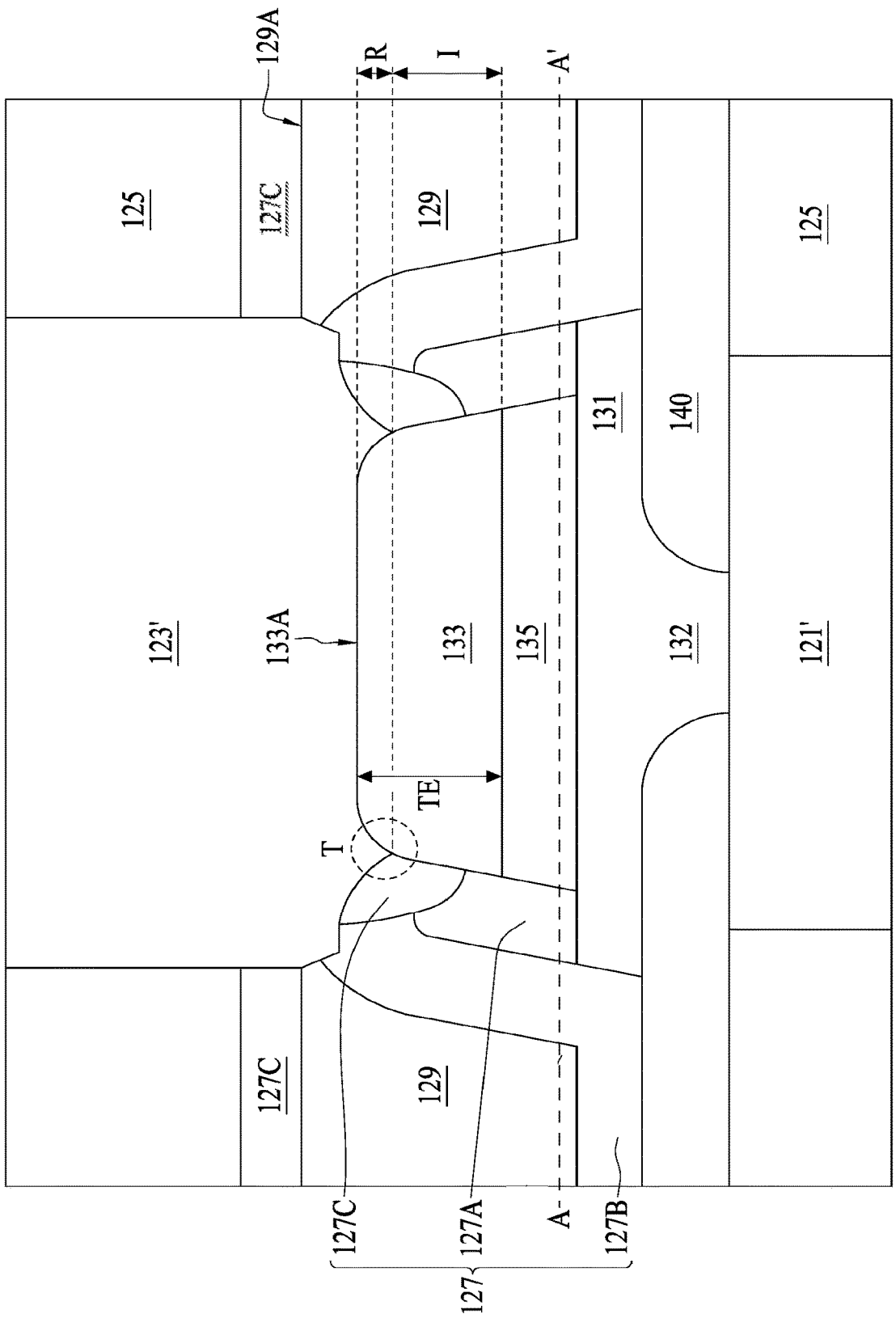
FIG. 15B is a cross section of an enlarged portion of the semiconductor structure of FIG. 15A, in accordance with some embodiments of the present disclosure.

In FIG. 15B, the MRAM structure in FIG. 15A is enlarged for further description. As shown in FIG. 15A, conductive metal fills the metal line trench/metal via trench (hereinafter "trenches") through, for example, a conventional Dual Damascene operation. The patterned trenches are filled with a conductive material by an electroplating operation, and excess portions of the conductive material are removed from the surface using a chemical mechanical polishing (CMP) operation, an etch operation, or combinations thereof. Details of electroplating the trenches are provided below. $(N+1)^{th}$ metal line 123' may be formed from W, and more preferably from copper (Cu), including AlCu (collectively, Cu). In one embodiment, $(N+1)^{th}$ metal lines 123' are formed using the Damascene operation, which should be familiar to those in the art. First, trenches are etched through the low k dielectric layer. This operation can be performed by plasma etch operation, such as an Inductively Coupled Plasma (ICP) etch. A dielectric liner (not shown) then may be deposited on the trenches sidewalls. In embodiments, the liner materials may include silicon oxide ($SiO_x$) or silicon nitride ($SiN_x$), which may be formed by plasma deposition operation, such as physical vapor deposition (PVD) or chemical vapor deposition (CVD) including plasma enhanced chemical vapor deposition (PECVD). Next, a seed layer of Cu is plated in the trenches. Note the seed layer of Cu may be plated over a top surface of the top electrode 133. Then a layer of copper is deposited in the trenches, followed by planarization of the copper layer, such as by chemical mechanical polishing (CMP), down to the top surface of a low k dielectric layer. The exposed copper surface and dielectric layer can be coplanar.

In FIG. 15B, the $(N+1)^{th}$ metal lines 123' is in contact with the top surface 133A and a portion of the sidewall in proximity to the top surface 133A of the top electrode 133. A triple point T where the $(N+1)^{th}$ metal lines 123', the dielectric layer 127, and the top electrode 133 meet is formed after the formation of the $(N+1)^{th}$ metal lines 123'. As previously described in FIG. 1, the recess region having a recess distance R and the isolation region having an isolation distance I are defined in the present operation. In some embodiments, the total thickens TE of the top electrode 133 is more than about 300 Å. Other features in FIG. 15B can be referred to those provided in FIG. 1.

Figure 15C:
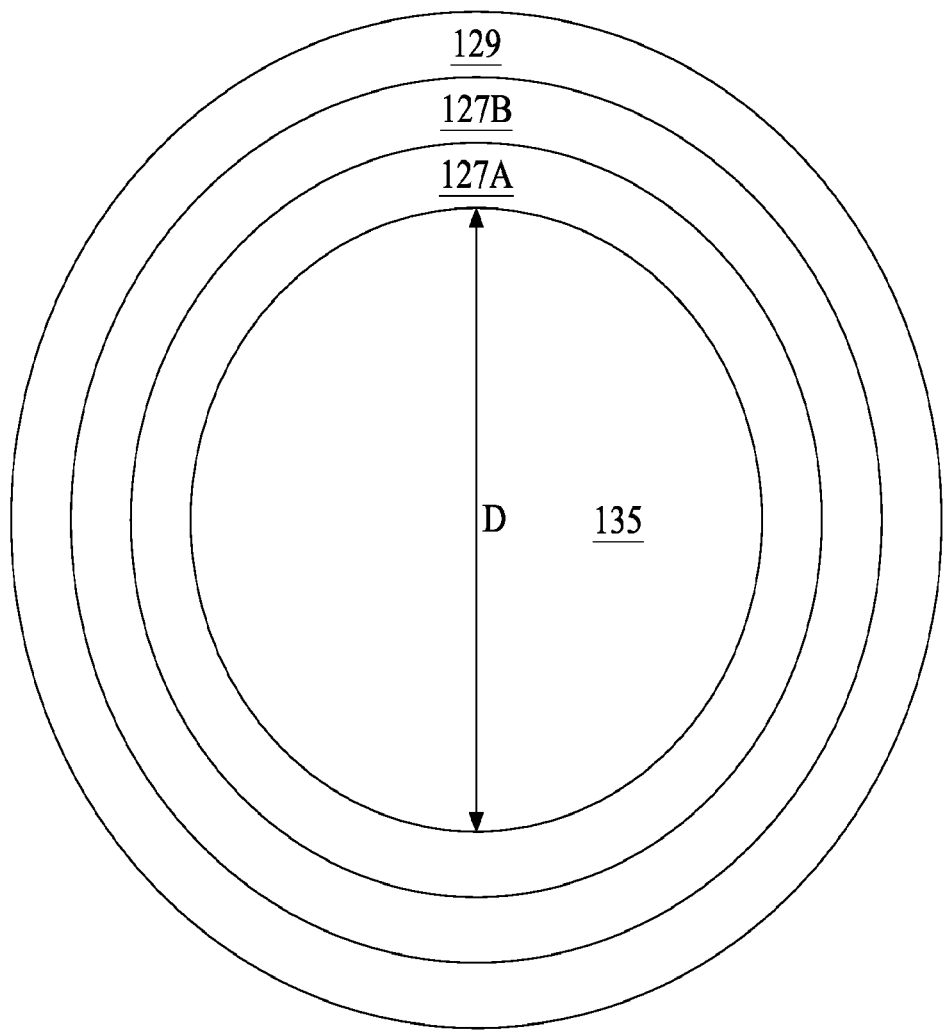
FIG. 15C is a top view of an enlarged portion of the semiconductor structure of FIG. 15B, in accordance with some embodiments of the present disclosure.

FIG. 15C is a top view of a surface dissecting along line AA' in FIG. 15B. It is shown that a diameter D of the MTJ 135, in some embodiments, is about 1000 Å. Under such circumstances, the isolation distance I of equal to or more than about 200 Å is sufficient to serve the isolation purpose between the top electrode 133 and the MTJ 135. Along line AA', the first dielectric layer 127A, and second dielectric layer 127B, and the dielectric layer 129 or IMD are all shown in FIG. 15C for clarity. In some embodiments, the smaller the diameter D of the MTJ 135, the thinner the isolation distance I is required.

Referring to FIG. 15B and FIG. 15C, since the selective etchant chemistry described above does not consume the top electrode 133 and the dielectric layer 129 in a noticeable manner, the thicknesses of the top electrode 133 and the dielectric layer 129 can be considered as identical to its original thickens. Hence, the thickens uniformity of the top electrode 133 and the dielectric layer 129 is improved compared to those obtained by the non-selective etch of the conventional approach. A better thickness uniformity of the top electrode 133 and the dielectric layer 129 lead to more uniform the resistance (i.e., smaller resistance variation) of the $(N+1)^{th}$ metal line 123' due to the fact that the thickness of the $(N+1)^{th}$ metal line 123' can be effectively controlled via a CMP operation. Alternatively stated, a broader CMP window can be adopted in order to obtain desired $(N+1)^{th}$ metal line 123' resistance uniformity. This cannot be achieved by the conventional approach where a non-selective etch changes the thicknesses of the top electrode 133 and the dielectric layer 129 simultaneously.

Figure 16:
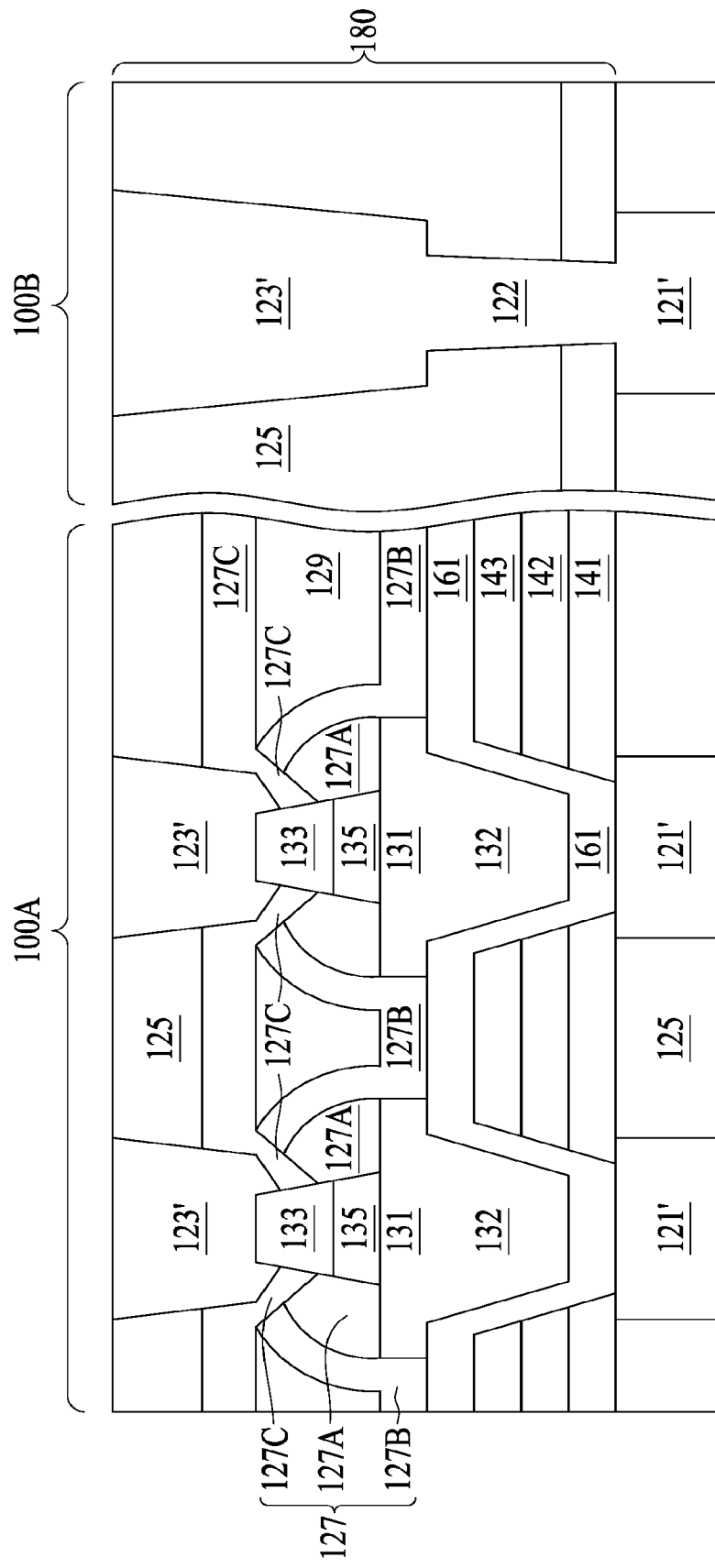
FIG. 16 is a cross section of a semiconductor structure fabricated in one operation, in accordance with some embodiments of the present disclosure.

Referring to FIG. 16, after the planarization operation removing the overburden of the conductive metal as illustrated in FIG. 15A, an $(N+1)^{th}$ metal line 123' in both the MRAM cell region 100A and the logic region 100B, as well as an $N^{th}$ metal via 122 in the logic region 100B, are formed. Subsequent processing may further include forming various contacts/vias/lines and multilayer interconnect features (e.g., metal layers and interlayer dielectrics) over the substrate, configured to connect the various features or structures of the integrated circuit device. The additional features may provide electrical interconnection to the device including the formed metal gate structures. For example, a multilayer interconnection includes vertical interconnects, such as conventional vias or contacts, and horizontal interconnects, such as metal lines. The various interconnection features may implement various conductive materials including copper, tungsten, and/or silicide. In one example a damascene and/or dual damascene operation is used to form a copper related multilayer interconnection structure.

Some embodiments of the present disclosure provide a semiconductor structure. The semiconductor structure includes an $N^{th}$ metal layer, a bottom electrode over the $N^{th}$ metal layer, a magnetic tunneling junction (MTJ) over the bottom electrode, a top electrode over the MTJ, and an $(N+M)^{th}$ metal layer over the $N^{th}$ metal layer. N and M are positive integers. The $(N+M)^{th}$ metal layer surrounds a portion of a sidewall of the top electrode.

Some embodiments of the present disclosure provide a semiconductor structure. The semiconductor structure includes a logic region and a memory region. The memory region includes an $N^{th}$ metal layer, a bottom electrode over the $N^{th}$ metal layer, a magnetic tunneling junction (MTJ) over the bottom electrode, a top electrode over the MTJ, and an $(N+1)^{th}$ metal layer over the top electrode. N is a positive integer. A thickness of the top electrode is more than about 300 Å.

Some embodiments of the present disclosure provide a method for manufacturing a semiconductor structure. The method includes forming a bottom electrode layer over an $N^{th}$ metal layer, forming a magnetic tunneling junction (MTJ) layer over the bottom electrode, forming a top electrode layer over the MTJ, patterning the top electrode layer and the MTJ layer to form a top electrode and an MTJ, forming a first dielectric layer surrounding a top surface and a sidewall of the top electrode, forming a second dielectric layer surrounding the top surface and the sidewall of the top electrode, and selectively removing a portion of the first dielectric layer and a portion of the second dielectric layer and exposing the top surface and the sidewall of the top electrode.

The foregoing outlines features of several embodiments so that those skilled in the art may better understand the aspects of the present disclosure. Those skilled in the art should appreciate that they may readily use the present disclosure as a basis for designing or modifying other operations and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:
1. A semiconductor structure, comprising:
an $N^{th}$ metal layer formed over a substrate;
a bottom electrode over the $N^{th}$ metal layer;
a magnetic tunneling junction (MTJ) over the bottom electrode;
a top electrode over the MTJ; and
an $(N+M)^{th}$ metal layer over the $N^{th}$ metal layer, N and M being nonzero, positive integers,
wherein an interface between the (N+M)th metal layer with the top electrode extends from a first point at an intersection of the interface between the (N+M)th metal layer and the top electrode and a dielectric material to a second point at an intersection of the (N+M)th metal layer and the top electrode, wherein the second point is further from the top surface of the substrate than the first point, wherein the dielectric material interfaces another portion of the top electrode below the first point, wherein the second point is measured at a midpoint of the interface between (N+M)th metal layer and the top electrode, wherein the dielectric material includes a first dielectric layer and wherein a second dielectric layer interfaces a third portion of the top electrode below the another portion of the top electrode, wherein a top surface of the second dielectric layer is higher than a top surface of the top electrode.

2. The semiconductor structure of claim 1, wherein the interface extending between the first point and the second point includes a curvilinear portion of a surface of the top electrode.

3. The semiconductor structure of claim 1, wherein the first point is on a sidewall of the top electrode and the second point of the interface is on an uppermost surface of the top electrode.

4. The semiconductor structure of claim 1, wherein the interface extending between the first point and the second point includes a linear tapered portion of a surface of the top electrode.

5. The semiconductor structure of claim 1, wherein the top electrode comprises TiN, TaN, Ta or Ru.

6. A semiconductor structure, comprising:
   a logic region; and
   a memory region, comprising:
      an Nth metal layer;
      a bottom electrode over the Nth metal layer;
      a magnetic tunneling junction (MTJ) over the bottom electrode;
      a top electrode over the MTJ, wherein the top electrode includes a bottom surface extending from a first point interfacing the MTJ to a second point interfacing the MTJ and a contiguous surface of the top electrode extends between the first point and the second point, the continuous surface opposing the bottom surface; and
      an (N+1)th metal layer over the top electrode, N being a nonzero, positive integer;
      an isolation region adjacent the top electrode; and
      wherein the (N+1)th metal layer interfaces a first region of the contiguous surface of the top electrode; and
      the isolation region interfaces a second region of the contiguous surface of the top electrode and a third region of the contiguous surface of the top electrode, the second region and the third region each being disposed entirely below the first region, wherein the isolation region extends to an interface with a top surface of the bottom electrode.

7. The semiconductor structure of claim 6, wherein the first region of the contiguous surface of the top electrode includes a curvilinear portion.

8. The semiconductor structure of claim 6, wherein a width of the top electrode measured at a point extending from the first region of the contiguous surface is less than a width of the bottom surface of the top electrode.

9. The semiconductor structure of claim 6, wherein the top electrode includes titanium or tantalum.

10. The semiconductor structure of claim 6, wherein the logic region comprises:
    another element of the Nth metal layer; and
    another element of the (N+1)th metal layer over the Nth metal layer.

11. The semiconductor structure of claim 6, wherein the isolation region includes a first dielectric layer interfacing the second region of the contiguous surface of the top electrode and the third region of the contiguous surface of the top electrode, a second dielectric layer interfacing the MTJ and a top surface of the bottom electrode, and a third dielectric layer interfacing a sidewall of the bottom electrode.

12. A semiconductor structure, comprising:
    a semiconductor substrate having a memory region and a logic region;
    a first metal line of an Nth metal layer in the memory region and a second metal line of the Nth metal layer in the logic region;
    a bottom electrode over the first metal line of the Nth metal layer, the bottom electrode has a top surface;
    a magnetic tunneling junction (MTJ) over a first portion of the top surface of the bottom electrode;
    a dielectric layer over a second portion and a third portion of the top surface of the bottom electrode, wherein the first portion interposes the second and third portions of the top surface of the bottom electrode and a sidewall of the bottom electrode, wherein the sidewall is transverse to the top surface;
    a top electrode over the MTJ, the top electrode interfaces the dielectric layer; and
    a first metal line of an (N+1)th metal layer over the top electrode, N being a positive, nonzero integer,
    wherein a surface of the top electrode interfaces the (N+1)th metal layer from a first terminal point of the interface abutting the dielectric layer to a second terminal point of the interface abutting the dielectric layer, and wherein a midpoint of the interface of the surface of the top electrode and the (N+1)th metal layer that lies between the first terminal point and the second terminal point is higher than the first terminal point and the second terminal point.

13. The semiconductor structure of claim 12, wherein the interface between the first terminal point and the midpoint is curvilinear.

14. The semiconductor structure of claim 12, further comprising: a second metal line of the (N+1)th metal layer disposed over the logic region and connected to the second metal line of the Nth metal layer by a via.

15. The semiconductor structure of claim 12, wherein the MTJ is coplanar with the second metal line of the (N+1)th metal layer along a plane defined parallel a top surface of the semiconductor substrate.

16. The semiconductor structure of claim 12, wherein a portion of the bottom electrode is coplanar with a via along another plane defined parallel the top surface of the semiconductor substrate.

17. The semiconductor structure of claim 12, wherein the dielectric layer is silicon nitride.

18. The semiconductor structure of claim 12, wherein the dielectric layer interfaces the top electrode at the first terminal point.

19. The semiconductor structure of claim 12, wherein the first terminal point is disposed on a first sidewall of the top electrode extending at an inclination with respect to a bottom surface of the top electrode and wherein the midpoint is disposed on a top surface of the top electrode extending substantially parallel to the bottom surface of the top electrode.

20. The semiconductor structure of claim 12, wherein the dielectric layer abuts the first terminal point at a first distance from a top surface of the substrate and the dielectric layer has an uppermost surface at a second distance from the top surface of the substrate, wherein the second distance is greater than the first distance.

* * * * *